United States Patent
Morris et al.

(10) Patent No.: US 11,734,471 B2
(45) Date of Patent: Aug. 22, 2023

(54) TOPOLOGY OPTIMIZATION FOR SUBTRACTIVE MANUFACTURING TECHNIQUES

(71) Applicant: AUTODESK, INC., San Francisco, CA (US)

(72) Inventors: Nigel Morris, Toronto (CA); Adrian Butscher, Toronto (CA); Francesco Iorio, Toronto (CA)

(73) Assignee: AUTODESK, INC., San Francisco, CA (US)

( * ) Notice: Subject to any disclaimer, the term of this patent is extended or adjusted under 35 U.S.C. 154(b) by 442 days.

(21) Appl. No.: 15/996,405

(22) Filed: Jun. 1, 2018

(65) Prior Publication Data

US 2018/0349531 A1 Dec. 6, 2018

Related U.S. Application Data

(60) Provisional application No. 62/515,231, filed on Jun. 5, 2017.

(51) Int. Cl.
*G06F 30/17* (2020.01)
*G06F 30/20* (2020.01)
(Continued)

(52) U.S. Cl.
CPC .............. *G06F 30/20* (2020.01); *B33Y 10/00* (2014.12); *B33Y 30/00* (2014.12); *B33Y 50/02* (2014.12);
(Continued)

(58) Field of Classification Search
CPC ......... B33Y 10/00; B33Y 30/00; B33Y 50/02; G06F 30/23; G06F 30/15; G06F 30/17;
(Continued)

(56) References Cited

U.S. PATENT DOCUMENTS 6,680,735 B1   1/2004  Seiler et al.
8,783,382 B2   7/2014  Ignova et al.
(Continued)

FOREIGN PATENT DOCUMENTS

JP       11345013 A   * 12/1999
WO    2015/127271 A1    8/2015

OTHER PUBLICATIONS

Sullivan et al. "High accuracy NC milling simulation using composite adaptively sampled distance fields", Computer-Aided Design 44, 2012, pp. 522-536. (Year: 2012).*

(Continued)

*Primary Examiner* — John E Johansen
(74) *Attorney, Agent, or Firm* — Artegis Law Group, LLP

(57) ABSTRACT

Design process that performs geometry synthesis on a 3D model of a product based on a design problem statement and manufacturing constraints associated with a manufacturing machine intended to manufacture the product. The manufacturing constraints may include dimensions for a tool bit, dimensions for a tool head, a set of machining directions of the manufacturing machine, or any combination thereof. For a 5-axis manufacturing machine, the set of machining directions may be determined by a "NormalSearch" algorithm and/or a "HeatSearch" algorithm. The geometry synthesis produces a design solution comprising a final 3D model of the product, whereby each point on the boundary of the final 3D model is determined to be accessible by a tool bit and/or tool head in at least one machining direction of the manufacturing machine. Thus, the design solution for the product is more easily and directly manufacturable by the manufacturing machine.

20 Claims, 9 Drawing Sheets

(51) Int. Cl.

| | |
|---|---|
| *B33Y 10/00* | (2015.01) |
| *G06T 15/06* | (2011.01) |
| *G05B 19/18* | (2006.01) |
| *B33Y 50/02* | (2015.01) |
| *B33Y 30/00* | (2015.01) |
| *G06F 30/15* | (2020.01) |
| *G06F 30/23* | (2020.01) |
| *G05B 13/04* | (2006.01) |
| *G06F 17/16* | (2006.01) |

(52) U.S. Cl.
CPC ............ *G05B 13/04* (2013.01); *G05B 19/182* (2013.01); *G06F 17/16* (2013.01); *G06F 30/15* (2020.01); *G06F 30/17* (2020.01); *G06F 30/23* (2020.01); *G06T 15/06* (2013.01); *G06T 2210/12* (2013.01)

(58) Field of Classification Search
CPC ....... G06F 17/16; G05B 13/04; G05B 19/182; G06T 15/06; G06T 2210/12
USPC .......................................................... 703/2
See application file for complete search history.

(56) References Cited

U.S. PATENT DOCUMENTS

| | | | | |
|---|---|---|---|---|
| 10,474,130 | B2* | 11/2019 | Nagata | G05B 19/4069 |
| 10,564,626 | B2* | 2/2020 | Nelaturi | G05B 19/4097 |
| 2005/0154481 | A1 | 7/2005 | Berger et al. | |
| 2009/0112354 | A1 | 4/2009 | El-Wardany et al. | |
| 2010/0085357 | A1 | 4/2010 | Sullivan et al. | |
| 2014/0005819 | A1 | 1/2014 | Garaas et al. | |
| 2014/0257551 | A1 | 9/2014 | Junod et al. | |
| 2015/0324491 | A1* | 11/2015 | Iorio | G06F 8/425 |
| | | | | 703/1 |
| 2016/0048124 | A1* | 2/2016 | Madhavan | G06F 30/20 |
| | | | | 700/173 |
| 2017/0372480 | A1 | 12/2017 | Anand et al. | |
| 2018/0040131 | A1 | 2/2018 | Zeng et al. | |
| 2018/0239334 | A1 | 8/2018 | Tramel, Jr. et al. | |

OTHER PUBLICATIONS

Liu et al. "3D level-set topology optimization: a machining feature-based approach", Struct Multidisc Optim 52, 2015, pp. 563-582. (Year: 2015).*

Allaire, Greégoire, François Jouve, and Anca-Maria Toader. "Structural optimization using sensitivity analysis and a level-set method." Journal of computational physics 194.1 (2004). pp. 363-393. (Year: 2004).*

Liu, Jikai, and Y-S. Ma. "3D level-set topology optimization: a machining feature-based approach." Structural and Multidisciplinary Optimization 52.3 (2015). pp. 563-582. (Year: 2015).*

Allaire, Grégoire, François Jouve, and Anca-Maria Toader. "Structural optimization using sensitivity analysis and a level-set method." Journal of computational physics 194.1 (2004). pp. 363-393. (Year: 2004).*

Non-Final Office Action received for U.S. Appl. No. 15/996,407 dated Oct. 18, 2019, 111 pages.

Allaire et al. "Structural Optimization Using Sensitivity Analysis and a Level-Set Method", Journal of Computational Physics, 194 vol. 1, Feb. 2004, pp. 363-393.

Bendsoe et al. "Generating Optimal Topologies in Structural Design using a Homogenization Method", Computer methods in applied mechanics and engineering, 1988, pp. 197-224.

"Practical Treatise on Milling and Milling Machines", Applied mathematical science, Brown & Sharpe Mfg. Co., Providence, Rhode Island, U.S.A., 1914.

Chen et al. "Computer-Aided Design and Applications", Computer-Aided Design and Applications, vol. 13, No. 1, 2016, pp. 86-94.

Guest et al. "Casting and Milling Restrictions in Topology Optimization via Projection-Based Algorithms", Proceedings of the ASME 2012 International Design Engineering Technical Conferences & Computers and Information in Engineering Conference IDETC/CIE 2012, vol. 3, 2012, pp. 913-920.

Liu et al. "3D Level-Set Topology Optimization: a Machining Feature-based Approach", Structural and Multidisciplinary Optimization, vol. 52, No. 3, Sep. 2015, pp. 563-582.

Wang et al. "A level set method for structural topology optimization", Computer Methods in Applied Mechanics and Engineering, vol. 192, 2003, pp. 227-246.

Osher et al. "Level Set Methods and Dynamic Implicit Surfaces", Applied Mathematical Sciences. Springer, New York, N.Y, vol. 153, 2003.

Sigmund et al. "Topology Optimization Approaches: A Comparative Review", Structural and Multidisciplinary Optimization, vol. 48 No. 6, Aug. 21, 2013, pp. 1031-1055.

Vatanabe et al. "Topology Optimization with Manufacturing Constraints: A Unified Projection-based Approach", Advances in Engineering Software, vol. 100, 2016, pp. 97-112.

Xia et al. "A Level Set Based Method for the Optimization of Cast Part", Structural and Multidisciplinary Optimization, vol. 41, No. 5, 2010, pp. 735-747.

Adalsteinsson et al. "The Fast Construction of Extension Velocities in Level Set Methods", Journal of Computational Physics, vol. 148, No. 1, Jan. 1999, pp. 2-22.

Final Office Action received for U.S. Appl. No. 15/996,407, dated Apr. 16, 2020, 39 pages.

Final Office Action received for U.S. Appl. No. 15/996,407 dated Dec. 10, 2021, 48 pages.

Non Final Office Action received for U.S. Appl. No. 15/996,407, dated Nov. 17, 2020, 35 pages.

Non Final Office Action received for U.S. Appl. No. 15/996,407, dated Jun. 28, 2022, 42 pages.

Final Office Action received for U.S. Appl. No. 15/996,407, dated Oct. 11, 2022, 44 pages.

Non Final Office Action received for U.S. Appl. No. 15/996,407, dated Jun. 20, 2023, 55 pages.

\* cited by examiner

TOPOLOGY OPTIMIZATION FOR SUBTRACTIVE MANUFACTURING TECHNIQUES

CROSS-REFERENCE TO RELATED APPLICATIONS

This application claims the benefit of United States provisional patent application titled "SUBTRACTIVE MANUFACTURING CONSTRAINT FOR LEVEL SET TOPOLOGY OPTIMIZATION," filed on Jun. 5, 2017 and having Ser. No. 62/515,231. The subject matter of this related application is hereby incorporated herein by reference.

BACKGROUND

Field of the Various Embodiments

Embodiments of the present invention generally relate to computer science and, more specifically, to topology optimization for subtractive manufacturing techniques.

Description of the Related Art

Subtractive manufacturing techniques are commonly used for manufacturing physical products that are designed through topology optimization. For example, these techniques are commonly used to manufacture metal-based products in the automotive and aerospace industries.

To manufacture a designed product using subtractive manufacturing techniques, a manufacturing machine, such as a computer numerical control (CNC) milling machine, begins with a solid block of material and gradually removes portions of material until the remaining material has a shape that resembles the designed product. A manufacturing machine may include a tool bit, tool head, and a table. The tool bit makes physical contact with the block of material to selectively remove material from the block. The tool head is connected with the tool bit and holds the tool bit, and the table holds the block of material in place during the manufacturing process. The process of selectively removing material from the block to produce the product may be referred to as machining or milling the block of material.

Conventional design techniques used to design products that are then manufactured using subtractive manufacturing machines typically employ topology optimization operations on a three-dimensional (3D) model of a product based on a design problem statement. The design problem statement usually specifies design goals and design constraints for the product. The topology optimization operations are performed to generate a design solution for the product that best achieves the design goals and design constraints specified in the design problem statement.

Notably, however, the conventional design techniques discussed above do not consider the inherent limitations/constraints of the subtractive manufacturing machines themselves. For example, manufacturing constraints of a subtractive manufacturing machine can include dimensions of the tool bit, dimensions of the tool head, and a set of machining/milling directions in which the tool bit can contact/strike the block of material. Instead, conventional design techniques focus on producing the best theoretical design solution that achieves the given design problem statement, without considering how the resulting product can actually be manufactured or the realities of the manufacturing limitations.

Accordingly, a technical drawback arising from conventional design techniques is that the topology optimization operations oftentimes produce a design solution for a product that cannot be directly or easily manufactured using a subtractive manufacturing machine. In particular, conventional design techniques can generate geometries in the design solution that cannot be replicated or achieved by a subtractive manufacturing machine due to the inherent limitations of the subtractive manufacturing machine. For example, a conventional design technique could produce a particular surface (such as a crevice) on a 3D model of the product that, during the manufacturing process, is not accessible by the subtractive manufacturing machine because the tool bit and/or tool head of the machine makes contact with another part of the product and/or the machine is not capable of the machining direction necessary to properly access the particular surface. Thus, conventional design techniques oftentimes produce designed products that can be manufactured only partially by a subtractive manufacturing machine and require a substantial amount of post-processing to complete the manufacturing process. Post-processing can include manual machining/milling of the portions of the product that the subtractive manufacturing machine cannot not access or reach. Such post-processing operations are labor intensive, time consuming, and increase the cost of manufacturing the product.

As the foregoing illustrates, there is a need in the art for more effective design techniques for that are manufactured using subtractive manufacturing machines.

SUMMARY

Various embodiments described herein include a computer-implemented method for designing a product for manufacture by a manufacturing machine. The method includes determining a design problem statement for the product and determining a set of dimensions associated with the manufacturing machine. The method further includes performing topology optimization on a three-dimensional (3D) model of the product based on the design problem statement and the set of dimensions associated with the manufacturing machine for generating a design solution for the product.

Various embodiments described herein include a computer-implemented method for designing a product for manufacture by a manufacturing machine. The method includes determining a set of machining directions for a tool bit of the manufacturing machine. The method further includes performing topology optimization on a three-dimensional (3D) model of the product based on a design problem statement for the product and the set of machining directions for generating a design solution for the product.

At least one technological improvement of the disclosed techniques relative to prior art is that the limitations/constraints of a manufacturing machine are considered when designing a product to be manufactured by the manufacturing machine. In particular, topology optimization operations are performed on a 3D model of the product based on the design problem statement for the product and a set of manufacturing constraints of the manufacturing machine. The set of manufacturing constraints generally includes a set of dimensions associated with the manufacturing machine. In some embodiments, the set of manufacturing constraints may include a set of dimensions for a tool bit of the manufacturing machine, a set of dimensions for a tool head of the manufacturing machine, a set of machining directions for a tool bit of the manufacturing machine, or any combination thereof.

By considering the manufacturing constraints of the manufacturing machine during the design process for the product, the disclosed techniques are able to generate a design solution for the product that is more easily and directly manufactured by the manufacturing machine when compared to a design solution generated by a conventional design technique. Further, the disclosed techniques generate design solutions for products that, when manufactured, require substantially less post-processing than typically required when conventional design techniques are used.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

Figure 1:
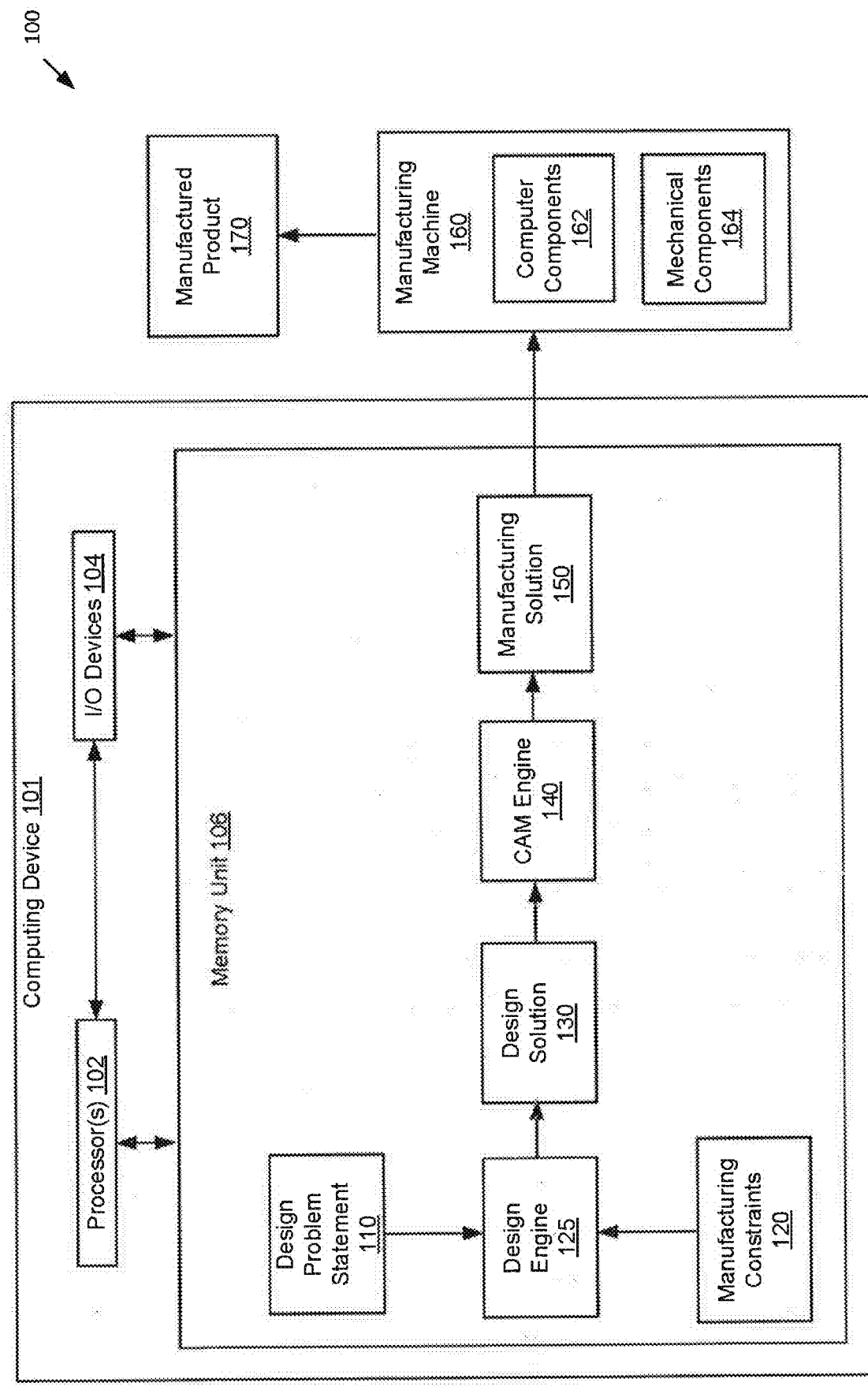
FIG. 1 illustrates a computer environment configured to implement one or more aspects of the present invention.

In the following description, numerous specific details are set forth to provide a more thorough understanding of the various embodiments. However, it will be apparent to one of skilled in the art that the inventive concepts may be practiced without one or more of these specific details.

Embodiments described herein include a design process for a product that implements topology optimization performed on an initial 3D model of the product. The product may be described by a design problem statement that specifies design goals and design constraints for the product.

Topology optimization comprises an iterative process whereby a surface boundary of the 3D model of the product is slightly adjusted/moved at each iteration to converge on a design solution that best achieves the specified design goals and design constraints. At each iteration, each discrete point x on the boundary may move outward in the direction of the surface normal (expand or grow away from the product), move inward in the opposite direction of the surface normal (contract or reduce towards the product), or remain at the same position. At each iteration, the movement of each point x on the boundary is defined by a velocity function $v(x)=v(x)n(x)$, whereby $v(x)$ is the speed function and $n(x)$ is the surface normal at point x. Thus, if the speed function is positive, then the boundary grows at point x in the direction of the surface normal; if the speed function is negative, then the boundary shrinks at point x in the opposite direction of the surface normal; if the speed function equals 0, then the boundary stays still at point x.

In some embodiments, at each iteration of the topology optimization, for each point x on the surface boundary of the 3D model of the product, the speed function $v(x)$ at point x is multiplied by a scalar function $\eta(x)$. For example, the scalar function $\eta(x)$ may have a value [0, 1]. The value of the scalar function $\eta(x)$ may be referred to herein as the "scalar function value." The scalar function value for point x may be determined based on the manufacturing constraints (milling constraints), such as the dimensions of the tool bit, the dimensions of the tool head, and the set of machining directions of a subtractive manufacturing machine. In these embodiments, at each iteration of the topology optimization, the value of the scalar function $\eta(x)$ is determined for each point x on the surface boundary. For at least a plurality of points on the surface boundary, it is determined if each point x is accessible by the tool bit and tool head in at least one machining direction in the set of machining directions. Using the dimensions of the tool bit and the tool head, a 3D model of a union of the tool bit and tool head may be generated to determine accessibility of each point x. For example, point x may be determined to be accessible by the tool bit and tool head in a particular machining direction if a tip of a 3D model of the union of the tool bit and tool head can access/contact point x without any other portion of the 3D model of the union of the tool bit and tool head making contact with any other portion (other than point x) of the surface of the 3D model of the product. If these conditions are not met, point x may be determined not to be accessible by the tool bit and tool head in a particular machining direction.

If point x is determined to not be accessible by the tool bit and tool head in at least one machining direction, then the scalar function value is set to equal 0. If point x is determined to be accessible by the tool bit and tool head in at least one machining direction, then the scalar function value is set to equal a positive value (e.g., a value greater than 0 through 1). If point x is accessible by the tool bit and tool head in a particular machining direction (referred to as an "accessible direction"), then the scalar function value is determined for the particular machining direction. In general, the closer a particular accessible direction is to the surface normal, the greater the scalar function value for the particular accessible direction. For example, an accessible direction that is parallel to the surface normal will have the highest possible scalar function value (e.g., 1) and an accessible direction that is perpendicular to the surface normal will have the lowest possible scalar function value (e.g., 0).

In some situations, point x may be accessible by the tool bit and tool head in two or more machining directions (two or more accessible directions) in the set of machining directions, whereby a scalar function value is determined for each such accessible direction. In these embodiments, the scalar function value for point x is set to equal the highest scalar function value that is determined for the two or more accessible directions. In general, a first accessible direction having a higher associated scalar function value is considered a "better" machining direction that a second accessible direction having a lower associated scalar function value, since the first accessible direction is closer to the surface normal at point x than the second accessible direction. Thus, when there are two or more accessible directions for point x, the "best" accessible direction having the highest scalar function value is selected for point x, whereby the scalar function value for point x is then set to equal this highest scalar function value. Using the "best" accessible direction to determine the scalar function value for point x allows the topology optimization to advance more rapidly to converge on the design goals since a higher scalar function value causes removal of more material at each iteration compared to a lower scalar function value.

By multiplying the speed function with the scalar function value $\eta(x)$ at each iteration of the topology optimization, this causes the velocity function to equal 0 at each point x on the boundary of the product that is not accessible by the tool bit and head in any of the machining directions. Thus, movement of each inaccessible point x on the boundary is stopped at the iteration. Further, multiplying the speed function with the scalar function value $\eta(x)$ ensures that during each iteration, an accessible point x on the boundary of the product is moved only in directions whereby point x on the modified boundary is still accessible by the tool bit and tool head. As discussed above, at each iteration of the topology optimization, each point x on the boundary may move along the surface normal direction ($n(x)$) or remain still. If point x is determined to be accessible by the tool bit and tool head in a particular machining direction, moving point x along the surface normal direction ($n(x)$) by the determined scalar function value ensures that point x on the modified boundary is still accessible from the same particular machining direction. In this manner, the topology optimization ensures that manufacturable shapes of the boundary are generated at each iteration.

Thus, the disclosed techniques perform topology optimization that iteratively converges on a design solution for the product that enforces/satisfies the design goals and design constraints, as well as enforcing/satisfying the manufacturing constraints. In other words, the disclosed techniques perform topology optimization on a 3D model of the product based on the design problem statement and a set of manufacturing constraints (milling constraints) for generating a design solution for the product. The generated design solution may comprise a final 3D model of the product to be physically produced by a subtractive manufacturing machine, whereby each point or portion on the surface boundary of the final 3D model is determined to be accessible by a tool bit and tool head in at least one machining direction of the subtractive manufacturing machine. Therefore, the disclosed techniques may generate a design solution for the product that is more easily and directly manufactured by the subtractive manufacturing machine than a design solution generated by conventional design techniques. Thus, the disclosed techniques may also generate a design solution for the product that when manufactured by the manufacturing machine, requires significantly less post-processing operations than a design solution generated by conventional design techniques.

In some embodiments, the subtractive manufacturing machine comprises a 3-axis manufacturing machine that is capable of machining directions along an arbitrary number of axes. In particular, during the manufacturing process, a machinist operating the 3-axis machine can manually reorient the product in any number of these machining directions. However, manually reorienting the product to a particular machining direction incurs significant set-up time and cost for creating jigs. When the subtractive manufacturing machine comprises a 3-axis manufacturing machine, the set of machining directions may be input by a user (e.g., +X, +Y, and +Z) depending on the user's desired machine configuration. As discussed above, the set of machining directions comprises those machining directions that are to be tested for accessibility to a particular point x on the boundary of the product. Due to the significant cost incurred for manually reorienting the product to a particular machining direction, the set of machining directions input by the user are relatively much lower in number than the set of machining directions determined for a 5-axis manufacturing machine.

In other embodiments, the subtractive manufacturing machine comprises a 5-axis manufacturing machine that is also capable of machining directions in an arbitrary number of axes. However, during the manufacturing process, a 5-axis manufacturing machine can automatically reorient the product in any number of these machining directions without requiring manual operations by a machinist. The large number of machining directions is achieved by a 5-axis manufacturing machine by tilting or rotating the tool head that holds the tool bit and/or tilting or rotating the table that holds the block of material to enable the additional machining directions. In these embodiments, when the product is to be manufactured by a 5-axis manufacturing machine, the disclosed techniques may automatically generate the set of machining directions for a particular point x on the boundary of the product, and test for accessibility of the particular point x using each machining direction in the set of machining directions. As the number of machining directions for a 5-axis manufacturing machine is theoretically infinite, it is impractical to add all possible machining directions to the set of machining directions and test for accessibility each machining direction in the set of machining directions. Thus, the disclosed techniques may implement novel "direction-selecting" algorithms that selectively determine which machining directions of a 5-axis manufacturing machine are to be added to the set of machining directions and tested for accessibility. These novel "direction-selecting" algorithms increase the likelihood of selecting a machining direction that can successfully access a particular point x on the boundary compared to, for example, randomly selecting various machining directions to be tested for accessibility. Determining accessible machining directions for points on the boundary allows the topology optimization to advance more rapidly to converge on the design goals, while also enforcing the design and manufacturing constraints. If accessible machining directions for various points on the boundary are not found, the scalar function values for these points are set to 0 and the topology optimization will not remove material that should be removed at these points, resulting in a larger, heavier, and less optimized design solution.

For illustrative purposes, level set based topology optimization comprises a design technique used to design the product in the embodiments described below. In other embodiments, other types of geometry synthesis techniques for designing and generating geometries for the product may be used without departing from the scope and spirit of the described embodiments. For example, other geometry synthesis techniques such as non-level set based topology optimization, genetic method, or evolutionary method may be used without departing from the scope and spirit of the described embodiments.

The following symbols and terms used in the description herein may be defined as follows:

r=tool bit radius;
b=tool bit length;
h=tool head radius;
$m_i$=unit vector representing a specific machining/milling direction;
M=set of machining/milling directions;
point x=a specific point on a boundary surface of the 3D model of the product;
v(x)=velocity function at point x=$\eta$(x)v(x)n(x) at point x;
$\eta$(x)=a scalar function value [0, 1] determined for point x;
v(x)=speed function at point x;
n(x)=unit vector representing the surface normal at point x;
$\Omega$=volume space occupied by the 3D model of the product (i.e., the product domain);
$\Omega$+=$\Omega$ offset by r or h (i.e., the offset domain);
$V_i(x)$=volume space occupied by a union of a 3D model of the tool bit and a 3D model of the tool head when oriented along the machining direction $m_i$ and the tip of the tool bit is located and contacting point x;
$V_{bit}(x)$=volume space occupied by a 3D model of the tool bit when oriented along the machining direction $m_i$ and the tip of the tool bit is located and contacting point x;
$V_{head}(x)$=volume space occupied by a 3D model of the tool head when oriented along the machining direction $m_i$ and the tip of the tool bit is located and contacting point x;
p=originating point for a casting ray in direction $-m_i$;
t=intersection point of casting ray and $\Omega$+.

The following description is divided into three sections. Section I describes a computer environment for designing a product for a subtractive manufacturing machine. Section II describes a design technique for designing a product based on manufacturing constraints. Section III describes a selection technique for selecting machining directions of a 5-axis subtractive manufacturing machine.

Section I: Design and Manufacturing Environment

FIG. 1 illustrates a computer environment 100 configured to implement one or more aspects of the present invention. The computer environment 100 may comprise an environment for designing a product for a subtractive manufacturing machine. As shown, the environment 100 includes a computing device 101 connected to a subtractive manufacturing machine 160 that produces a manufactured product 170.

Computing device 101 may be a server system, client system, workstation, a laptop computer, a tablet or handheld device, or any other type of computing device. Computing device 101 includes one or more processing units 102 coupled to input/output (I/O) devices 104 and to memory unit 106. Processing unit(s) 102 may be a central processing unit (CPU), a graphics processing unit (GPU), or a combination of different processing units, such as a CPU configured to operate in conjunction with a GPU. In general, processing unit 102 may be any technically feasible hardware unit capable of processing data and/or executing software applications. I/O devices 104 are also coupled to memory unit 106 and incudes input devices capable of receiving user input, output devices capable of generating output, as well as network devices capable of communicating via a network (not shown). Examples of input devices include a keyboard, a mouse, a touchscreen, a microphone, or other input elements. Examples of output devices include a monitor display, audio speakers/headphones, a printer, or other output elements. I/O devices 104 may be configured to receive various types of input from an end-user of the environment 100, and to also provide various types of output to the end-user of the environment 100. In particular, the I/O devices may further include a subtractive manufacturing machine 160.

The memory unit 106 may include a hard disk, a random access memory (RAM) module, a flash memory unit, or any other type of memory unit or combination thereof. Processor 102 and I/O devices 104 are configured to read data from and write data to memory 106. The memory unit 106 is configured to store software application(s) and data. Instructions from the software constructs within the memory unit 106 are executed by processors 102 to enable the inventive operations and functions described herein. In various embodiments, the memory unit 106 is configured to store a design problem statement 110, manufacturing constraints 120, a design engine 125, one or more design solutions 130, a computer-aided manufacturing (CAM) engine 140, and one or more manufacturing solutions 150 to provide an underlying functionality of techniques described in various embodiments herein.

In general, a design problem statement 110 may comprise a high-level engineering problem defined as a set of design requirements and a definition of a design space that each generated design solution for a product must satisfy. The set of design requirements may be considered a set of mechanical requirements that are expressed in terms of mechanical or functional requirements for the design solutions. The set of design requirements may include one or more design goals and one or more design constraints. A design goal may specify a property in the design solution to be maximized or minimized, such as maximizing stiffness, minimizing displacement, or minimizing mass or volume. A design goal may specify optimizations for the design solution and include measurable criteria for evaluating the effectiveness of the design solution (how well the design solution solves the design problem). For example, a design goal may specify a minimum weight and a minimum volume for a product, while still satisfying the other design constraints. A design constraint may specify a value of a property of the design solution that the design solution must satisfy, such as a maximum stress below the yield stress or a maximum volume. Thus, a design constraint sets a quantifiable value of a property that the design solution must meet. For example, a design constraint may specify that the "maximum chassis beam diameter is 3 cm," or "maximum support height is 1 meter." In general, the design constraints may define forces that the design solution/product must tolerate in a real-world environment.

In some embodiments, in addition to satisfying/achieving the design problem statement 110, each generated design solution for a product must also satisfy/achieve a set of manufacturing constraints 120 associated with the subtractive manufacturing machine 160 that is intended to manufacture the product. In some embodiments, the set of manufacturing constraints 160 may include a set of physical dimensions associated with the manufacturing machine 160. The set of manufacturing constraints 160 may include a set of physical dimensions for a tool bit of the manufacturing machine 160, a set of physical dimensions for a tool head of the manufacturing machine 160, a set of physical machining directions for a tool bit of the manufacturing machine 160, or any combination thereof. The set of manufacturing constraints 160 may also be referred to herein as "milling constraints."

The design engine 125 may receive the design problem statement 110 for a product and the set of manufacturing constraints 120 and generate at least one design solution 130 that satisfies both the design problem statement 110 and the set of manufacturing constraints 120. The design engine 125 may implement a design technique that utilizes a form of topology optimization. In some embodiments, the design engine 125 implements a boundary-based topology optimization and also implements a level-set topology optimization, as discussed below in Section II. For illustrative purposes, the design engine 125 implements level set based topology optimization to design the product. In other embodiments, the design engine 125 may implement any other type of geometry synthesis technique for designing and generating geometries for the product, such as non-level set based topology optimization, genetic method, or evolutionary method. Each design solution 130 generated by the design engine 125 may comprises a final 3D model of the product that satisfies both the design problem statement 110 and the set of manufacturing constraints 120. In some embodiments, each point or portion on the surface boundary of the final 3D model of the product is determined to be accessible by a tool bit and tool head in at least one machining direction of the subtractive manufacturing machine 160.

A design solution 130 may be received by the CAM engine 140, which produces a manufacturing solution 150 based on the received design solution 130. The CAM engine 140 may implement computer-aided manufacturing (CAM) software (such as Autodesk® PowerMill™ or Fusion™) that specifies the precise movements of the tool bit for removal of the block material and for manufacturing/milling the product based on the received design solution 130. The manufacturing solution 150 may describe the movements of the tool bit for manufacturing the product, for example, using G programming language (G-code). The manufacturing solution 150 may be stored to a file, which is then transmitted to the manufacturing machine 160 that produces the manufactured product 170 based on the manufacturing solution 150. Thus, the CAM engine 140 translates the design solution 130 for the product to a manufacturing solution 150 that is executable by the manufacturing machine 160 to manufacture the product 170.

A subtractive manufacturing machine 160 may comprise a manufacturing machine capable of manufacturing/producing a physical product using reductive methods, such as a computer numerical control (CNC) milling machine. The subtractive manufacturing machine 160 comprises a set of computer components 162 and a set of mechanical components 164. The set of mechanical components 164 may include a tool bit (such as a rotary cutter), tool head, and a table. The tool bit makes physical contact with a block of material to selectively remove material from the block. The tool head is connected with the tool bit and holds the tool bit, and the table rigidly and securely holds the block of material in place during the manufacturing process. The computer components 162 may comprise a CPU and memory for receiving and processing the manufacturing solution 150 to control the set of mechanical components 164 for manufacturing the product 170. To manufacture a product, the subtractive manufacturing machine 160 begins with a solid block of material and gradually removes portions of material according to the received manufacturing solution 150. The block of material used may comprise any type of suitable material, such as a metal-based material, ABS plastic, polylactic acid (PLA) plastic, resin, nylon, or any other suitable material.

In some embodiments, the subtractive manufacturing machine 160 comprises a 3-axis manufacturing machine. In other embodiments, the subtractive manufacturing machine comprises a 5-axis manufacturing machine that is automatically capable of machining directions in an arbitrary number of axes. Theoretically, a 5-axis manufacturing machine is capable of any number of machining directions, although there are some limitations to the number of machining directions in practice. The large number of machining directions is achieved by a 5-axis manufacturing machine by tilting or rotating the tool head that holds the tool bit and/or tilting or rotating the table that holds the block of material to enable the additional machining directions. As used herein, a machining direction comprises an orientation direction that the tool bit and tool head can attack the block of material to remove and shape the block of material.

Section II: Designing a Product Based on Manufacturing Constraints

In general, designing products based on structural analysis have become particularly popular. Structural analysis typically involves implementing one or more topology optimization algorithms to produce optimized designs based on structural performance of the designs. Topology optimization typically includes iteratively processing an initial 3D model of a product that represents a maximum volume of the product in terms of the amount of material needed to manufacture the product. During such operations, volume/material is iteratively removed from or added to the 3D model based on a structural analysis of the 3D model. More specifically, a simulation of the flow of forces through the maximum volume is produced, and based on how the forces are distributed throughout the maximum volume, the topology optimization algorithm progressively removes volume/material from areas of the maximum volume having the least amount of stress, while also adding volume/material to areas of the maximum volume having greater amounts of stress. Topology optimization may be implemented via finite element analysis (FEA) algorithms to create accurate simulations of how forces are distributed throughout a volume and of the resulting deformations and stresses present within the volume. In this fashion, topology optimization may be used to generate optimized designs that have as little volume/material as possible while maintaining a level of structural integrity that satisfies the design problem statement 110.

In some embodiments, the design engine 125 utilizes level set-based topology optimization for designing the product based on the design problem statement 110 (comprising design goals and design constraints) and the manufacturing constraints 120. In these embodiments, level set-based topology optimization may implement a level set function that represents a surface boundary of the 3D model of the product. In general, the level set-based topology optimization may start with an initial level set function that represents a surface boundary of an initial 3D model of the product. The initial 3D model may comprise an infeasible space where many of the design and manufacturing constraints are violated. The level set-based topology optimization is then performed to iteratively move the surface boundary of the 3D model to a feasible space where the design and manufacturing constraints are not violated while also achieving the design goals (maximizing or minimizing the design goals).

In particular, the level set-based topology optimization comprises an iterative process whereby the level set function representing the boundary is iteratively modified/updated in a manner that progressively improves/converges on the design goals while also progressively reducing any violations of the design constraints and manufacturing constraints until a feasible and locally optimal 3D model is achieved. A feasible 3D model comprises a 3D model that achieves/satisfies the design problem statement 110 while also achieving/satisfying the manufacturing constraints 120. Thus, in a feasible 3D model, the design and manufacturing constraint violations are reduced to zero. A locally optimal 3D model comprises a 3D model that best achieves/satisfies the design problem statement 110 and manufacturing constraints 120 given the initial starting point of the topology optimization (the initial 3D model of the product). By enforcing the manufacturing constraints 120 during the topology optimization, the resulting design solution may have the following characteristics. First, the radius of curvature of each portion of the surface of the 3D model does not exceed the tool bit radius. Second, each point x of the surface of the 3D model will be accessible by the tip of the tool bit from at least one machining/milling direction without any other portion of the tool bit or any portion of the tool head contacting any other portion (other than point x) of the surface of the 3D model.

In some embodiments, at each iteration of the topology optimization, the design engine 125 slightly adjusts/moves the surface boundary of the 3D model to converge on the design goals while also reducing any violations of the design constraints and manufacturing constraints. At each iteration, each discrete point x on the boundary may move outward in the direction of the surface normal (expand or grow away from the product), move inward in the opposite direction of the surface normal (contract or reduce towards the product), or remain at the same position. At each iteration, the movement of each point x on the boundary is defined by a velocity function v(x) expressed by equation (1).

$$v(x) = \eta(x)v(x)n(x) \quad (1)$$

where:
$\eta(x)$=scalar function value [0, 1] determined for point x;
v(x)=speed function;
n(x)=surface normal at point x.

The velocity function v(x) varies from point to point along the boundary of the 3D model and implements advection velocity to move points on the surface in an inward or outward direction along the normal to the boundary. If the speed function is positive, then the boundary grows at point x in the direction of the surface normal; if the speed function is negative, then the boundary shrinks at point x in the opposite direction of the surface normal; if the speed function equals 0, then the boundary stays still at point x. At each iteration of the topology optimization, for each point x on the surface boundary of the 3D model of the product, the speed function v(x) at point x is multiplied by a scalar function $\eta(x)$ of value [0, 1]. The value of the scalar function $\eta(x)$ may be referred to herein as the "scalar function value." The scalar function value for point x may be determined based on the manufacturing constraints, such as the dimensions of the tool bit, the dimensions of the tool head, and the set of machining directions of a subtractive manufacturing machine.

At each iteration of the topology optimization, the design engine 125 determines a scalar function value $\eta(x)$ of each point x on the boundary. In some embodiments, the scalar function $\eta(x)$ is expressed by equation (2):

$$\eta(x) = \begin{cases} 0 & \text{if } v(x) \geq 0 \\ \max\{|m_i \cdot n(x)|: \text{ all } m_i \in M \text{ s.t. } V_i(x) \cap \Omega = \emptyset\} & \text{otherwise} \end{cases} \quad (2)$$

where:
$m_i$=unit vector representing a specific machining/milling direction;
M=set of possible machining/milling directions;
$\Omega$=volume space occupied by the 3D model of the product (i.e., the product domain);
$V_i(x)$=volume space occupied by a union of a 3D model of the tool bit and a 3D model of the tool head when oriented along the machining direction $m_i$ and the tip of the tool bit is located and contacting point x.

As shown in the top half of equation (2), for each point x having a speed function that is greater or equal to 0 (v(x)≥0), the scalar function value is set to equal 0. Thus, at a point x having a positive speed function indicating growth, the design engine 125 clamps/stops growth at point x to avoid occlusion of any previously accessible portions of the boundary surface of the product.

Thus, the bottom half of equation (2) is performed only for each point x having a negative speed function. For each point x having a negative speed function, the design engine 125 sets the scalar function value $\eta(x)$ to equal the maximum value for the absolute value of the dot product of the unit vector surface normal n(x) at point x and a unit vector for a current machining direction $m_i$, at point x, over all accessible machining directions in the set of machining directions M. The absolute of the dot product of the surface normal n(x) and a machining direction $m_i$, may be referred to herein as the "absolute dot product value" for the machining direction $m_i$. Thus, the design engine 125 tests each machining direction $m_i$ in the set of machining directions M for accessibility to current point x. For each machining direction determined to be accessible to current point x, the design engine 125 then determines the absolute dot product value of the accessible machining direction and sets the scalar function value $\eta(x)$ to equal the maximum absolute dot product value for all accessible machining directions. Thus, for a point x having multiple accessible machining directions, the accessible machining direction having the maximum absolute dot product value is used determine the scalar function value for point x.

Further, for each machining direction determined not to be accessible to current point x, absolute dot product value for the inaccessible machining direction equals 0. Thus, for each point x having a negative speed function that is determined to have no accessible machining directions in the set of possible machining directions M, then point x is determined to be inaccessible and the design engine 125 sets the scalar function value for point x to equal 0.

The design engine may use various algorithms described below to determine whether point x is accessible by a particular machining direction $m_i$. In general, the design engine 125 may use dimensions of the tool bit and the tool head to generate a 3D model of a union of the tool bit and tool head (referred to as the "3D model of the union") for determining accessibility of each point x. The 3D model of the union may comprise a 3D model of the tool bit combined with a 3D model of the tool head. A "tip" of the 3D model of the union may comprise a tip of the 3D model of the tool bit. Point x may be determined to be accessible by a particular machining direction $m_i$ if the tip of the 3D model of the union can contact/access point x on the 3D model of the product without any other portion of the 3D model of the union contacting any other portion (other than point x) of the 3D model of the product (i.e., $V_i(x) \cap \Omega = \emptyset$). If these conditions are not met, point x may be determined not to be accessible by the particular machining direction. In other words, point x is determined to not be accessible by a particular machining direction $m_i$ if, when the tip of the 3D model of the union contacts point x on the 3D model of the product, at least one other portion of the 3D model of the union also makes contact with another portion of the 3D model of the product (i.e., $V_i(x) \cap \Omega \neq \emptyset$).

Thus, as described above, if point x is determined to not be accessible in at least one machining direction, then the scalar function value is set to equal 0. If point x is determined to be accessible by at least one machining direction, then the scalar function value is set to equal a positive value (e.g., a value greater than 0 through 1). When point x is accessible in two or more machining directions in the set of machining directions, a scalar function value is determined for each such accessible direction and the scalar function value for point x is set to equal the highest scalar function value that is determined for the two or more accessible directions. In general, a first accessible direction having a higher associated scalar function value is considered a "better" machining direction that a second accessible direction having a lower associated scalar function value, since the first accessible direction is closer to the surface normal at point x than the second accessible direction.

By multiplying the speed function with the scalar function value $\eta(x)$ at each iteration of the topology optimization, this causes the velocity function to equal 0 at each point x on the boundary of the product that is not accessible by the tool bit and head in any of the machining directions. Thus, movement of each inaccessible point x on the boundary is stopped at the iteration. Further, multiplying the speed function with the scalar function value $\eta(x)$ ensures that during each iteration, an accessible point x on the boundary of the product is moved only in directions whereby point x on the modified boundary is still accessible by the tool bit and tool head. If point x is determined to be accessible by the tool bit and tool head in a particular machining direction, moving point x along the surface normal direction (n(x)) by the determined scalar function value ensures that point x on the modified boundary is still accessible from the same particular machining direction. In this manner, the topology optimization ensures that manufacturable shapes of the boundary are generated at each iteration.

Thus, the disclosed techniques perform topology optimization that iteratively converges on a design solution for the product that enforces/satisfies the design goals and design constraints, as well as enforcing/satisfying the manufacturing constraints. In other words, the disclosed techniques perform topology optimization on a 3D model of the product based on the design problem statement and a set of manufacturing constraints (milling constraints) for generating a design solution for the product. The generated design solution may comprise a final 3D model of the product to be physically produced by a subtractive manufacturing machine, whereby each point or portion on the surface boundary of the final 3D model is determined to be accessible by a tool bit and tool head in at least one machining direction of the subtractive manufacturing machine.

Figure 2:
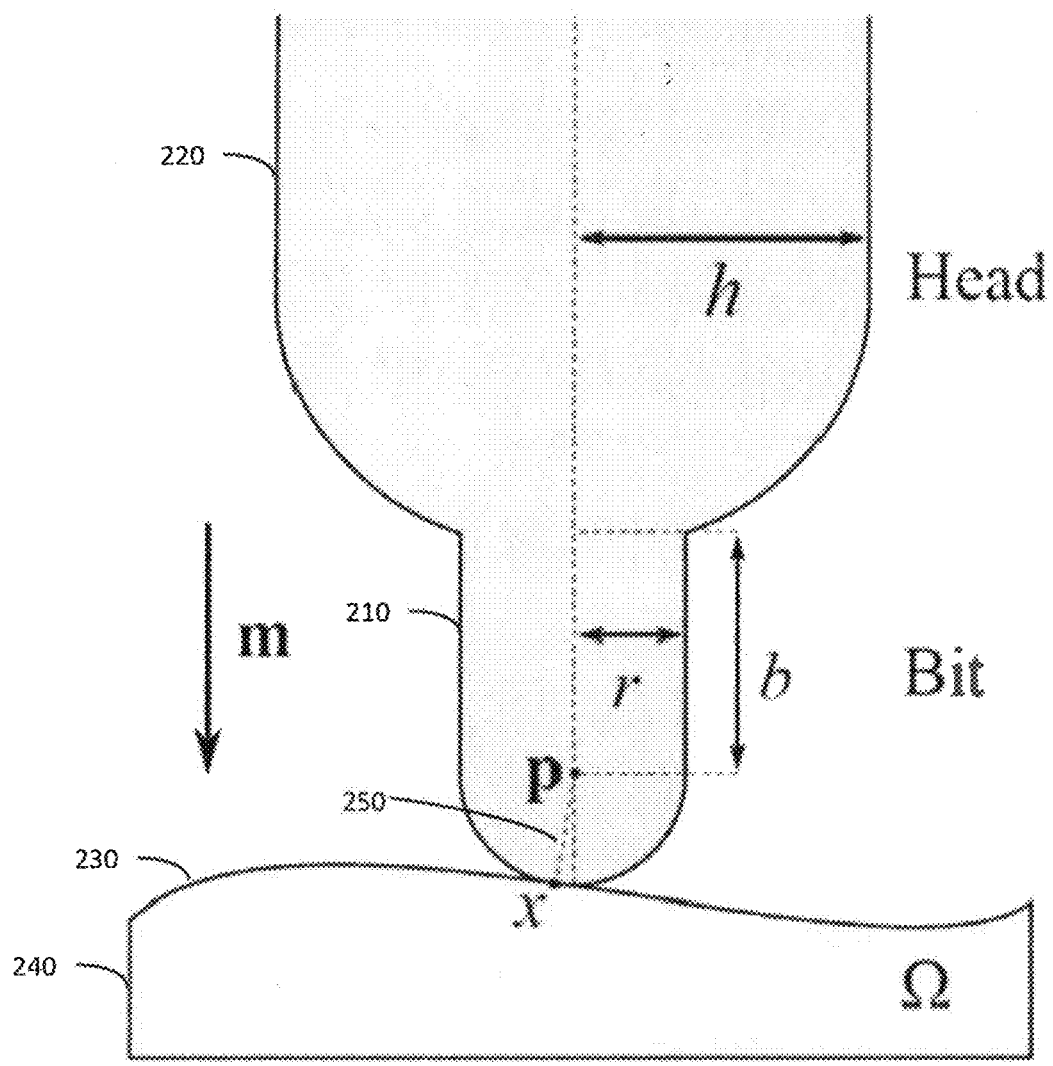
FIG. 2 is a conceptual diagram of a 3D model of the union of a tool bit and a tool head, according to various embodiments of the present invention.

FIG. 2 is a conceptual diagram of a 3D model of a union of a tool bit and a tool head, according to various embodiments of the present invention. As shown, the 3D model of a union of the tool bit and the tool head comprises a 3D model of the tool bit 210 combined with a 3D model of the tool head 220. The 3D model of the tool bit 210 is defined by a set of dimensions of the tool bit including a tool bit radius r and a tool bit length b. As shown, the 3D model of the tool bit comprises a cylinder (having a radius r and a length b) which is capped by a hemisphere oriented in a particular machining direction m towards the 3D model of the product. In some embodiments, the hemisphere or capped end of the tool bit may comprise the tip of the 3D model of union and the tip of the 3D model of the tool bit. The 3D model of the tool head 220 is defined by a set of dimensions of the tool head including a tool head radius h. The 3D model of the union is oriented in a particular machining direction m. The tip of the 3D model of the union (comprising the tip of the 3D model of the tool bit 210) makes contact with a surface boundary 230 of a 3D model of the product 240 (represented as domain $\Omega$) at point x. Also shown is a surface normal 250 at point x.

As the machining direction $m_i$ and the surface normal n(x) at point x are each unit vectors (comprising triples whose norm is 1), when these unit vectors are parallel to each other the absolute dot product value equals 1 and when these unit vectors are perpendicular to each other the absolute dot product value equals 0. Thus, the closer a particular accessible direction is to the surface normal, the greater the scalar function value for the particular accessible direction. In general, a first accessible direction having a higher associated scalar function value is considered a "better" machining direction that a second accessible direction having a lower associated scalar function value, since the first accessible direction is closer to the surface normal at point x than the second accessible direction. Thus, when there are two or more accessible directions for point x, the "best" accessible direction having the highest scalar function value is selected for point x, whereby the scalar function value for point x is then set to equal this highest scalar function value.

As used in various algorithms described herein, $V_{bit}(x)$ may represent a volume space occupied by a 3D model of the tool bit when oriented along the machining direction $m_i$ and the tip of the tool bit is located and contacting point x on the boundary of the product. $V_{head}(x)$ may represent a volume space occupied by a 3D model of the tool head when oriented along the machining direction $m_i$ and the tip of the tool bit is located and contacting point x on the boundary of the product. Thus, $V_i(x)$ may represent a volume space occupied by a union of a 3D model of the tool bit and a 3D model of the tool head when oriented along the machining direction $m_i$ and the tip of the tool bit is located and contacting point x on the boundary of the product.

Figure 3A:
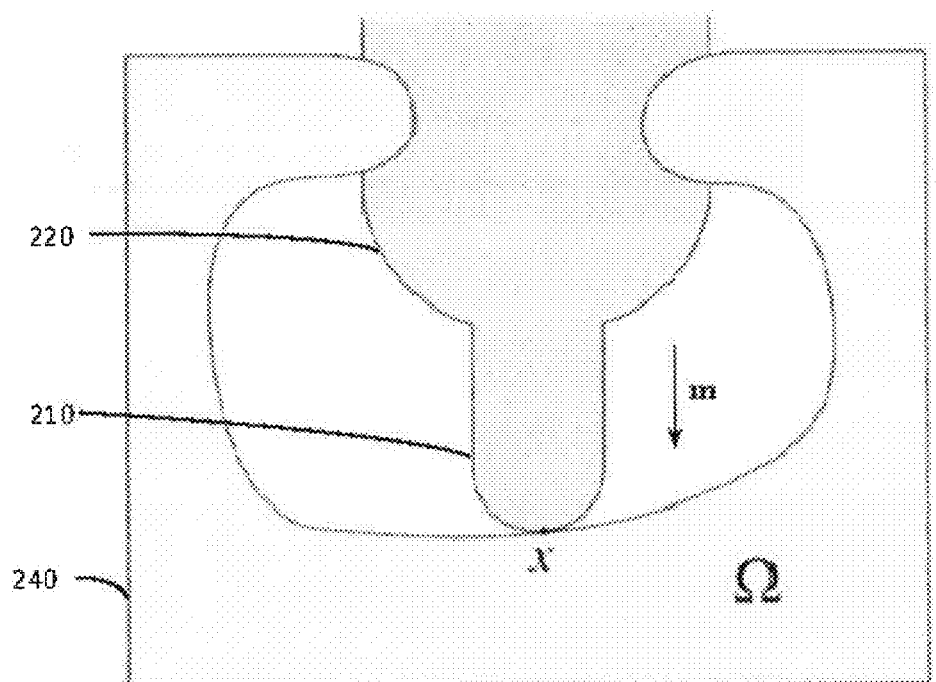
FIG. 3A is a conceptual diagram of an inaccessible machining direction, according to various embodiments of the present invention.

FIG. 3A is a conceptual diagram of an inaccessible machining direction, according to various embodiments of the present invention. As shown, when oriented in a particular machining direction, when the tip of the 3D model of the union (the tip of the 3D model of the tool bit 210) makes contact with the surface boundary of a 3D model of the product 240 at point x, at least one other portion of the 3D model of the union makes contact with at least one other portion of the 3D model of the product 240. Thus, the particular machining direction shown in FIG. 3A is determined to be an inaccessible machining direction for point x and the absolute dot value product of the particular machining direction is determined to equal 0.

Figure 3B:
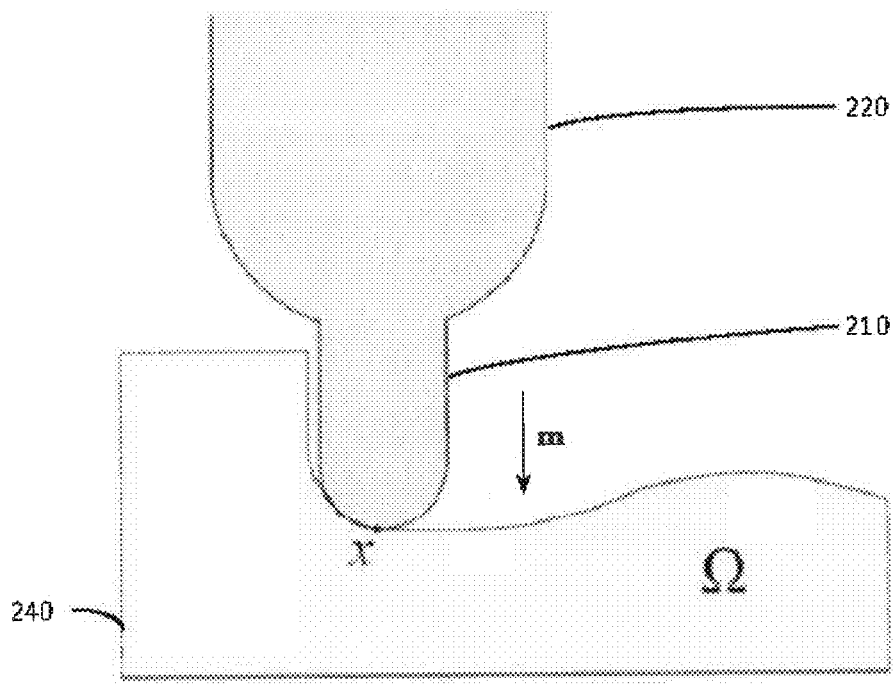
FIG. 3B is a conceptual diagram of an accessible machining direction, according to various embodiments of the present invention.

FIG. 3B is a conceptual diagram of an accessible machining direction, according to various embodiments of the present invention. As shown, when oriented in a particular machining direction, when the tip of the 3D model of the union (the tip of the 3D model of the tool bit 210) makes contact with the surface boundary of a 3D model of the product 240 at point x, no other portion of the 3D model of the union makes contact with any other portion of the 3D model of the product 240. Thus, the particular machining direction shown in FIG. 3A is determined to be an accessible machining direction for point x and the absolute dot value product of the particular machining direction is determined to be a positive value.

The design engine 125 may use various algorithms described below to determine whether a particular point x on the boundary of the product is accessible by a particular machining direction $m_i$. Some of the various algorithms may implement a ray casting technique to determine the accessibility or inaccessibility of a particular point x by a particular machining direction $m_i$. In these embodiments, the design engine 125 may perform a first ray casting operation for the tool bit and a second ray casting operation for the tool head to determine whether point x is accessible by a particular machining direction $m_i$.

Figure 4:
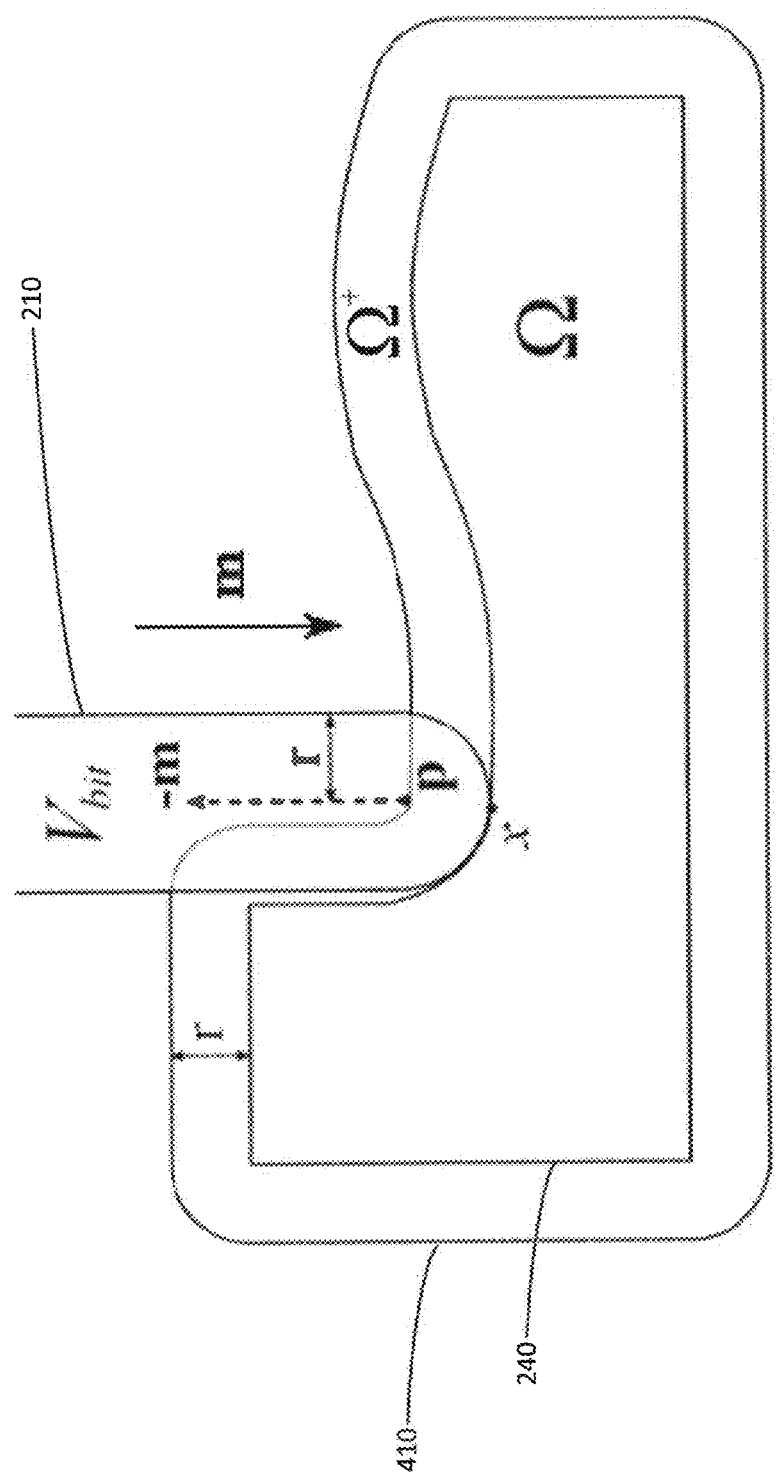
FIG. 4 is a conceptual diagram of a ray casting technique, according to various embodiments of the present invention.

FIG. 4 is a conceptual diagram of a ray casting technique, according to various embodiments of the present invention. A first ray casting operation shown in FIG. 4 may apply to determining whether a tool bit can access a particular point x on the boundary of the product using a particular machining direction m without any other portion of the tool bit making contact with any other portion of the product. As shown, when oriented in a particular machining direction m, when the tip of the 3D model of the tool bit 210 (having radius r and defined by volume $V_{bit}$) makes contact with the surface boundary of a 3D model of the product 240 (represented by product domain Ω) at point x, no other portion of the 3D model of the tool bit 210 makes contact with any other portion of the 3D model of the product 240. The accessibility of point x using the particular machining direction may be determined by casting a ray in direction −m that originates at point p. A 3D model of the product offset by tool bit radius r is generated and represented as offset domain $Ω^+$ 410. Thus, the boundary of the 3D model of the product is offset by tool bit radius r to produce an "offset boundary" of the 3D model of the product. Point p is offset from point x by radius r in the direction of the surface normal at point x. Thus, the location of point p (corresponding to point x on the boundary of domain Ω) is at the intersection of the boundary of offset domain $Ω^+$ and the surface normal at point x (i.e., p=x+n(x)*r). In some embodiments, if the casting ray originating at p in direction −m intersects the boundary of offset domain $Ω^+$ (Ω offset by r) at an intersection point t, it is then determined that the 3D model of the tool bit 210 contacts/intersects the 3D model of the product 240 (i.e., $V_{bit} \cap Ω \neq \emptyset$). If the casting ray does not intersect the boundary of offset domain $Ω^+$, it is then determined that the 3D model of the tool bit 210 does not contact/intersect the 3D model of the product 240 (i.e., $V_{bit} \cap = \emptyset$).

A second ray casting operation may be performed to determine whether a tool head can access a particular point x on the boundary of the product using a particular machining direction m without any other portion of the tool head making contact with any other portion of the product. However, in the second ray casting operation, the offset domain Ω+ comprises Ω offset by tool head radius h. Also, the casting ray in direction −m originates at point p' which corresponds to point x on the boundary of domain Ω, wherein p'=p−m (b+h). Here, b equals the tool bit length and h equals the tool head radius. In some embodiments, if the casting ray originating at p' in direction −m intersects the offset domain $Ω^+$ (Ω offset by h) at an intersection point t, it is then determined that the 3D model of the tool head 220 contacts/intersects the 3D model of the product 240 (i.e., $V_{head} \cap Ω \neq \emptyset$). If the casting ray does not intersect the offset domain $Ω^+$, it is then determined that the 3D model of the tool head 220 does not contact/intersect the 3D model of the product 240 (i.e., $V_{head} \cap Ω = \emptyset$).

The design engine 125 may then combine the results of the first and second ray casting operations to determine whether point x is accessible by a particular machining direction $m_i$. In particular, it is determined that point x is accessible by machining direction $m_i$ if it is determined that the 3D model of the tool bit 210 does not contact the 3D model of the product 240 (i.e., $V_{bit} \cap Ω = \emptyset$) and it is determined that the 3D model of the tool head 220 does not contact the 3D model of the product 240 (i.e., $V_{head} \cap Ω = \emptyset$). In other words, it is determined that point x is accessible by machining direction $m_i$ (i.e., $V_i \cap Ω = \emptyset$) if $V_{bit} \cap Ω = \emptyset$ and $V_{head} \cap Ω = \emptyset$. Otherwise, point x is determined not to be accessible by machining direction $m_i$. In other words, it is determined that point x is not accessible by machining direction $m_i$ if it is determined that either the 3D model of the tool bit 210 contacts the 3D model of the product 240 (i.e., $V_{bit} \cap Ω \neq \emptyset$) or it is determined that the 3D model of the tool head 220 contacts the 3D model of the product 240 (i.e., $V_{head} \cap Ω \neq \emptyset$). Thus, it is determined that point x is not accessible by machining direction $m_i$ (i.e., $V_i \cap Ω \neq \emptyset$) if either $V_{bit} \cap Ω \neq \emptyset$ or $V_{head} \cap Ω \neq \emptyset$.

The design engine 125 may use various algorithms described herein to perform topology determine to achieve the design problem statement while enforcing the manufacturing constraints 120. In particular, the design engine 125 may perform level set-based topology optimization by implementing the below level set Algorithms 1-4 that are available in level set libraries. In these embodiments, Algorithms 5-11 discussed herein may call one or more of Algorithms 1-4 to perform one or more specific functions. The functions performed by the level set Algorithms 1-4 are expressed by the following pseudo-code:

---

Algorithm 1: LevelSetRayCast

---

Input: Level set, rayStart, rayDirection, levelSetValue, hitPoint

Result: Returns true if the ray crosses the level set at levelSetValue
and stores the intersection point in hitPoint

---

Algorithm 2: LevelSetOffset

---

Input: Level set Ω, offset value o

Result: Applies an offset of o to the signed distance function for Ω
such that the zero-levelset is uniformly advanced outwardly
in the direction of on, where n is the surface normal.
If the level set is narrow band then the narrow band must be
updated such that it centers on the new zero-level set.

---
Algorithm 3: LevelSetAdvection
---
Input: Level set $\Omega$, scalar field v, time t
Result: Solves the Hamilton-Jacobi equation on the signed
distance function with the speed defined by the scalar
field v over a duration t. Note that a velocity extension
method improves the stability of advection [1].
---

---
Algorithm 4: LevelSetClose
---
Input: Level set $\Omega$, close value o
Result: Morphological operation that performs an offset
by o followed by an inset or negative offset of o.
The result is a removal of holes of radius o.
---

As shown, Algorithm 1 receives as input Level set, rayStart, rayDirection, levelSetValue, and hitPoint and returns true if the ray crosses the level set at levelSetValue and stores the intersection point in hitPoint. Algorithm 1 executes a "LevelSetRayCast" function that casts a ray originating from starting point (rayStart) in a direction (rayDirection) which, if the ray intersects the surface of the 3D model of the product, returns the location of the intersection location at hitPoint. Algorithm 1 may be to test for intersection between the 3D model of the tool bit and the 3D model of the product and for intersection between the 3D model of the tool head and the 3D model of the product the holder.

As shown, Algorithm 2 receives as input level set $\Omega$ and offset value o and applies an offset of o to the signed distance function for $\Omega$ such that the zero-level set is uniformly advanced outwardly in the direction of own, where n is the surface normal. Algorithm 2 executes a "LevelSetOffset" function that expands (or contracts) the boundary of the 3D model of the product by a uniform amount.

As shown, Algorithm 3 receives as input level set $\Omega$, scalar field v, and time t and solves the Hamilton-Jacobi equation on the signed distance function with the speed function defined by the scalar field v over a duration t. Algorithm 3 executes a "LevelSetAdvection" function that moves the boundary of the 3D model of the product in the normal direction by an amount determined by a the speed function.

As shown, Algorithm 4 receives as input level set $\Omega$ and close value o and performs a morphological operation that performs an offset by o followed by an inset or negative offset of o. The result is a removal of holes of radius o. Algorithm 4 executes a "LevelSetClose" function that uses Algorithm 2 to offset the boundary of the 3D model of the product and then inset the boundary of the 3D model of the product resulting in removal of small holes and sharp concave corners in the boundary of the 3D model of the product.

The operations performed by Algorithm 5 is expressed by the following pseudo-code:

---
Algorithm 5: Milling Constraint
---
Input: Level set of $\Omega$, n, set of milling directions $\mathcal{M}$, algorithm mode, max search iterations
maxIters
Result: Evaluation of $\eta$
Extend narrow-band of $\Omega$ up to h;
for x on boundary of $\Omega$ do
    p = x + n · r;
    iter = 0;
    q = p;
    for $m_i$ in $\mathcal{M}$ do
        accessible = MillingTest($\Omega$,n(x),p,$m_i$,$\eta$(x));
        if iter < maxIters then
            SearchDirections ($\Omega$,n,$\mathcal{M}$,algorithm mode, accessible);
            iter = iter + 1;
        end
    end
end
---

As shown, Algorithm 5 receives as input level set Ω, n, set of milling directions M, algorithm mode, and max search iterations (maxIters) and determines the scalar function value η(x). Algorithm 5 executes a "Milling Constraint" operation that iterates through each point x on the boundary of the 3D model of the product. For each point x, Algorithm 5 iterates through each machining/milling direction $m_i$ in the set of machining/milling directions M to test for accessibility of a current point x by calling Algorithm 6 "MillingTest." Note that for the "SearchDirections" section (from "if iter<maxIters then" to "end") is only performed for a product intended for a 5-axis manufacturing machine, whereby Algorithm 5 calls on Algorithm 9 "SearchDirections" for determining which machining/milling directions are to be added to the set of milling directions M for testing by Algorithm 6 "MillingTest." Algorithm 9 "SearchDirections" may call on Algorithm 7 "NormalSearch" and Algorithm 8 "HeatSearch." Algorithms 7-9 are discussed below in Section III. For a product intended for a 3-axis manufacturing machine, set of milling directions M is already determined and the "SearchDirections" section may be deleted.

The operations performed by Algorithm 6 is expressed by the following pseudo-code:

---

Algorithm 6: MillingTest: Level set evaluation for $V_i(x) \cap \Omega$

---

Input: Level set Ω, n(x), p, $m_i$, η(x)
Result: Returns accessibility enum. If $m_i$ is accessible, it updates η(x)
        for this $m_i$ otherwise returns intersection point t
// Tool bit test
if n(x) · $m_i$ < 0 then
    hit = LevelSetRayCast(Ω,p,−$m_i$,r,t);
    if !hit then
        // Head test
        hit = LevelSetRayCast(Ω,p − $m_i$(b + h),−$m_i$,h,t);
        if !hit then
            η(x) = max (η(x), −$m_i$ · n(x));
            return Accessible;

---

Algorithm 6: MillingTest: Level set evaluation for $V_i(x) \cap \Omega$

--- end
    else
        return HeadNotAccessible;
    end
end
return BitNotAccessible;

As shown, Algorithm 6 performs a level set evaluation for $V_i(x) \cap \omega$. Algorithm 6 receives as input level set Ω, n(x), p, and η(x) and returns accessibility enumeration, such that if point x is accessible using current $m_i$, then updates the value for η(x) for the current $m_i$, and otherwise returns the intersection point t. The value for "hit" may comprise a Boolean output value from Algorithm 1 "LevelSetRayCast" which is equal to true when the ray cast intersects a boundary of the 3D model of the product and false when it detects no intersection with the boundary of the 3D model of the product. Thus, Algorithm 6 determines the scalar function value η(x) for a current machining direction $m_i$ for a current point x. Algorithm 6 may determine if the current point x is accessible by the current machining direction $m_i$ by combining the results of the first and second ray casting operations for the tool bit and the tool head, as discussed in relation to FIG. 4 If the current point x is found accessible by the current machining direction $m_i$, Algorithm 6 then returns the scalar function value η(x) for the current machining direction $m_i$, otherwise Algorithm 6 returns the intersection point t.

The design engine 125 may implement a strict algorithm (Algorithm 10) that prevents growth (i.e., a positive speed function) at each point x on the boundary of the 3D model of the product or implement a relaxed algorithm (Algorithm 11) that allows growth at various points x on the boundary of the 3D model of the product. The operations performed by Algorithm 10 is expressed by the following pseudo-code:

---

Algorithm 10: Level Set Topology Optimization with CNC Constraint Strict Algorithm

---

Input: Initial part domain Ω, Boundary conditions, Objective function, Milling parameters
    r,b and h, set of milling directions $\mathcal{M}$
Result: Optimized version of Ω
for each iter do
    EvaluateSensitivities(Ω,Boundary conditions,Objective function);
    v = ComputeShapeDerivative( );
    η = MillingConstraint(Ω,n,$\mathcal{M}$ ,maxIters);
    for x on boundary of Ω do
        if v(x) > 0 then
            η(x) = 0
        end
    end
    LevelSetAdvection(Ω,ηv);
    if Objective function converged then
        break;
    end
end
LevelSetClose(Ω,r);

When implementing Algorithm 10, at each iteration of the topology optimization, each point x on the boundary may only remain at the same position (i.e., the speed function equals 0) or move inward in the opposite direction of the surface normal (i.e., a negative speed function) so that the manufacturing constraints are never violated during any iteration of the topology optimization. At each iteration, the physical qualities (such as Von Mises stress or Strain energy or Volume) are evaluated using necessary solvers (e.g. FEA solver) which are then used to compute the speed function based on that shape derivatives of the design goals. The shape derivatives of the design goals may indicate how to locally modify the boundary of the product to improve/converge on the design goals. The milling constraint η is obtained by calling Algorithm 5 and positive speed function value are removed that could allow for boundary growth. The boundary shape Ω is then updated by a level set advection with ηv as the speed function value. Use of Algorithm 10 ensures that accessible material of the product is removed at each iteration and requires that the initial shape of Ω (the initial 3D model of the product) comprise a feasible start that is fully accessible. When the topology optimization has converged a locally optimal 3D model of the product (given the initial 3D model of the product), the topology optimization may be stopped. Convergence on the local optimum can be tested when either the boundary gradient approaches zero (indicating that locally modifying the boundary will not improve convergence on the design goals) or the changes in the boundary between the last iteration and the current iteration is below a threshold. The final step of Algorithm 10 performs the morphological closing of Ω, which adds fillets and fills any cavities smaller than the tool bit radius r that have been created.

The operations performed by Algorithm 11 is expressed by the following pseudo-code:

---

Algorithm 11: Level Set Topology Optimization with CNC Constraint Relaxed Algorithm Input: Initial part domain Ω, Boundary conditions, Objective function, Milling parameters
    r,b and h, set of milling directions $\mathcal{M}$
Result: Optimized version of Ω
for each iter do
    EvaluateSensitivities(Ω,Boundary conditions);
    v = ComputeShapeDerivative( );
    $v_{max}$ = max(v);
    η = MillingConstraint(Ω,n,$\mathcal{M}$,maxIters);
    for x on boundary of Ω do
        if η(x) == 0 then
            v(x) = α$v_{max}$
        else
            v(x) = η(x)v(x)
        end
    end
    LevelSetAdvection(Ω,v);
    if Objective function converged then
        break;
    end
end
LevelSetClose(Ω,r);

---

When implementing Algorithm 11, each iteration of the topology optimization may allow growth at various points x on the boundary of the 3D model of the product to allow material addition, but a growth term is applied to parts of the boundary of the 3D model of the product that are not accessible in order to obtain a feasible solution. Thus, Algorithm 11 allows for positive values in the speed function at various points x so that an infeasible design solution (i.e., an infeasible initial 3D model of the product) may be used, wherein the topology optimization eventually converges to a feasible design solution that achieves both the design problem statement and the manufacturing constraints. In order to converge to a feasible design solution, a positive velocity function is applied wherever an inaccessible portion of Ω is detected (i.e., wherever==0), thus filling in cavities or otherwise inaccessible portions of Ω. For example, growth rate values between α=0.1 and α=0.25 may be used, whereby a represents a parameter of Algorithm 11 that determines how quickly the topology optimization will recover from an infeasible design solution. When the 3D model of the product Ω has portions that are inaccessible from any machining direction, Algorithm 11 may grows the inaccessible portion at a growth rate determined by a until the inaccessible portion becomes accessible.

Figure 5:
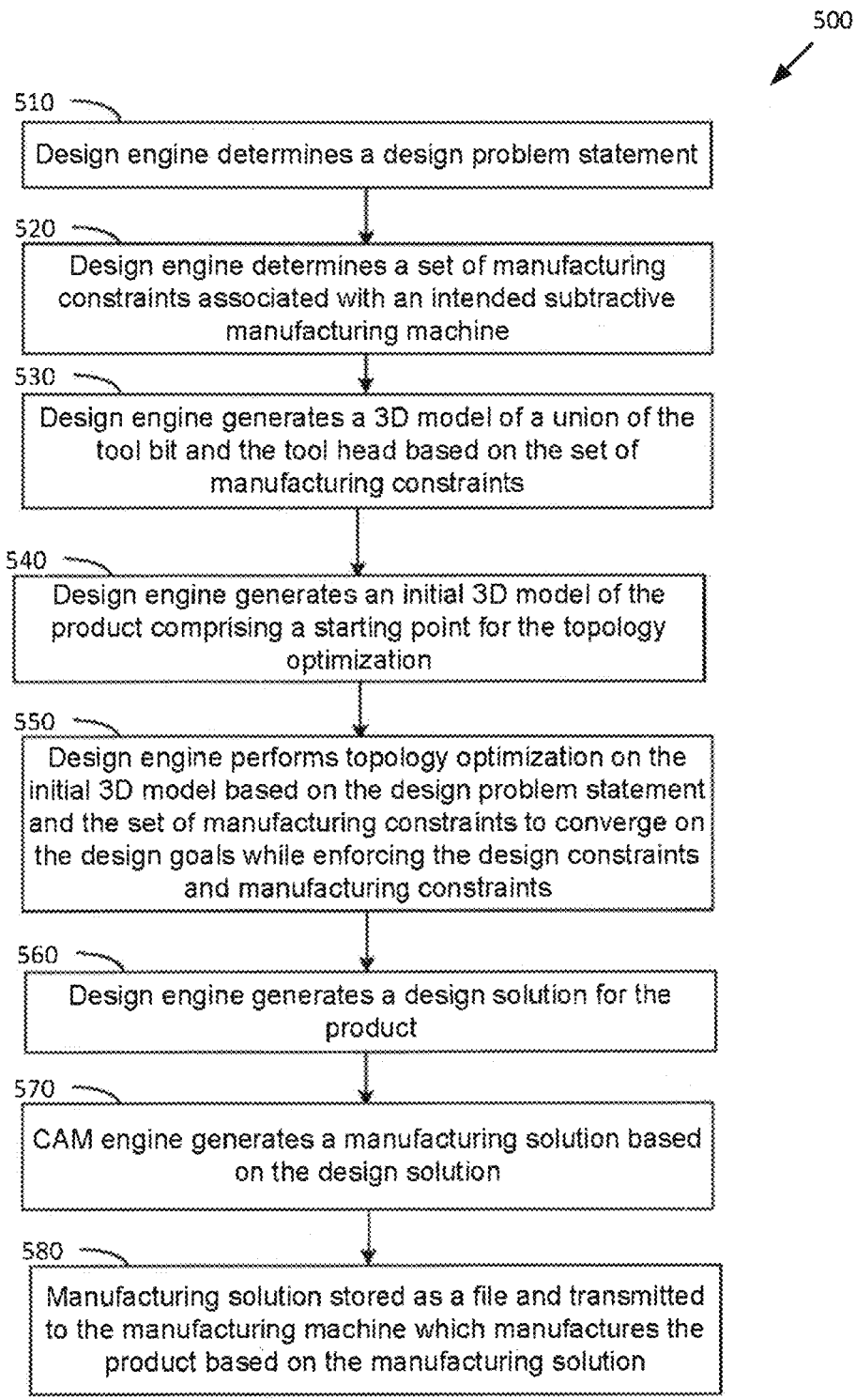
FIG. 5 illustrates a flow diagram of method steps for performing topology optimization when designing a product based on manufacturing constraints, according to various embodiments of the present invention.

FIG. 5 illustrates a flow diagram of method steps for performing topology optimization for designing a product based on manufacturing constraints, according to various embodiments of the present invention. Although the method steps are described in conjunction with the systems of FIGS. 1-4, persons skilled in the art will understand that the method steps can be performed in any order by any system. In some embodiments, the method 500 may be performed by a design engine 125 in conjunction with a CAM engine 140 and a subtractive manufacturing machine 160. For illustrative purposes, the design engine 125 implements level set based topology optimization to design the product. In other embodiments, the design engine 125 may implement any other type of geometry synthesis technique for designing and generating geometries for the product.

The method 500 begins when the design engine 125 determines (at step 510) a design problem statement 110 comprising one or more design goals (to be maximized or minimized) and one or more design constraints. For example, the design problem statement 110 may be received from a user. The design engine 125 determines (at step 520) a set of manufacturing constraints 120 associated with the subtractive manufacturing machine 160 that is intended to manufacture the product. For example, the set of manufacturing constraints 120 may be received from a user. The set of manufacturing constraints 160 may include a set of dimensions for a tool bit of the manufacturing machine 160 (such as a tool bit radius and length), a set of dimensions for a tool head of the manufacturing machine 160 (such as a tool head radius), a set of machining directions for a tool bit of the manufacturing machine 160, or any combination thereof.

If the intended subtractive manufacturing machine 160 comprises a 3-axis manufacturing machine, the set of machining directions may be received from a user. If the intended subtractive manufacturing machine 160 comprises a 5-axis manufacturing machine, the set of possible machining directions may be determined automatically (without user intervention) by the design engine 125 using Algorithms 7-9 discussed below in Section III.

The design engine 125 generates (at step 530) a 3D model of a union of the tool bit and the tool head based on the set of manufacturing constraints 160. For example, the design engine 125 may generate a 3D model of the tool bit based on the set of dimensions for the tool bit and generate a 3D model of the tool head based on the set of dimensions for the tool head and combine the 3D models to form the 3D model of the union. The design engine 125 also generates (at step 540) an initial 3D model of the product comprising a starting point for the topology optimization.

The design engine 125 then performs (at step 550) topology optimization on an initial 3D model of the product based on the design problem statement 110 and the set of manufacturing constraints 120 to converge on the design goals while enforcing the design constraints and manufacturing constraints. In some embodiments, at each iteration of the topology optimization, for each discrete point x on the boundary of the 3D model of the product, the design engine 125 determines a velocity function v(x) for determining movement (inward, output, or no movement) of point x. In some embodiments, the movement of each point x at each iteration is defined by the velocity function v(x) expressed in equation (1), whereby η(x) comprise a scalar function value. In some embodiments, the scalar function value η(x) of each point x is determined using equation (2) and the set of manufacturing constraints (such as the dimensions of the tool bit, the dimensions of the tool head, the set of machining directions of a subtractive manufacturing machine, or any combination thereof). For a 3-axis manufacturing machine 160, the set of machining directions may be received from a user. For a 5-axis manufacturing machine 160, the set of machining directions may be determined using Algorithms 7-9 discussed below in Section III. At each iteration, a current point x is determined to accessible or not accessible by the tool bit and tool head in a particular machining direction using the 3D model of the union of the tool bit and tool head and the current 3D model of the product. If point x is determined to not be accessible by the tool bit and tool head in at least one machining direction, then the scalar function value is set to equal 0. If point x is determined to be accessible by the tool bit and tool head in at least one machining direction, then the scalar function value is set to equal a positive value (e.g., a value greater than 0 through 1). If point x is accessible by the tool bit and tool head in two or more accessible directions, then the scalar function value for point x is determined based on the accessible direction that is closest to the surface normal at point x.

By multiplying the speed function with the scalar function value at each iteration of the topology optimization at step 550, this causes the velocity function to equal 0 at each point x on the boundary of the product that is not accessible by the tool bit and head in any of the possible machining directions. Thus, movement of each inaccessible point x on the boundary is stopped at the iteration. Further, multiplying the speed function with the scalar function value ensures that during each iteration, an accessible point x on the boundary of the product is moved only in directions whereby point x on the modified boundary is still accessible by the tool bit and tool head. Thus, the topology optimization at step 550 iteratively converges on a design solution for the product that enforces/satisfies the design goals and design constraints, as well as enforcing/satisfying the manufacturing constraints. In other words, the disclosed techniques perform topology optimization on a 3D model of the product based on the design problem statement and a set of manufacturing constraints (milling constraints) for generating a design solution for the product. Topology optimization performed at step 550 may continue until a locally optimal 3D model of the product is reached. A locally optimal 3D model may comprise a 3D model of the product that best achieves/satisfies the design problem statement 110 and manufacturing constraints 120 given the initial starting point of the topology optimization (the initial 3D model of the product), and further iterations will not produce further improvements.

The design engine 125 then generates (at step 560) a design solution for the product. The design solution may comprise a final 3D model of the product to be physically produced by the intended manufacturing machine 160, whereby each point or portion on the surface boundary of the final 3D model is determined to be accessible by a tool bit and tool head in at least one machining direction of the intended manufacturing machine 160. The CAM engine 140 then generates (at step 570) a manufacturing solution 150 based on the design solution 130. The CAM engine 140 may implement CAM software that specifies the precise movements of the tool bit for removal of the block material and for manufacturing/milling the product based on the received design solution 130. The manufacturing solution 150 is stored as an executable file and transmitted (at step 580) to the manufacturing machine 160, which then manufactures the product based on the manufacturing solution 150. The method 500 then ends.

In alternative embodiments, the design engine 125 may receive a design solution for the product that is generated by any type of geometry synthesis technique, the design solution comprising a final 3D model of the product to be manufactured by a manufacturing machine 160. The design engine 125 may then determine if the geometries of the final 3D model are manufacturable by the intended manufacturing machine 160. In these embodiments, the design engine 125 may test whether each point or portion on the surface boundary of the final 3D model is accessible by a tool bit and tool head in at least one machining direction of the intended manufacturing machine 160 using the methods and technique described herein.

Section III: Determining Machining Directions for a 5-Axis Manufacturing Machine In some embodiments, the subtractive manufacturing machine comprises a 5-axis manufacturing machine that is capable of machining directions in an arbitrary number of axes. As the number of machining directions for a 5-axis manufacturing machine is theoretically infinite, it is impractical to add all possible machining directions to the set of machining directions M and test for accessibility each machining direction in the set M. In these embodiments, the disclosed techniques may automatically determine the set of machining directions M for a particular point x on the boundary of the 3D model of the product at each iteration of the topology optimization. In particular, the disclosed techniques may implement novel "direction-selecting" algorithms (such as Algorithms 7-9) that select which machining directions of a 5-axis manufacturing machine are to be added to the set of machining directions M which are then tested for accessibility (as described above in Section II).

These novel "direction-selecting" algorithms increase the likelihood of selecting a machining direction that can successfully access a particular point x on the boundary compared to, for example, randomly selecting various machining directions to be added to the set of machining directions M. Determining accessible machining directions for points on the boundary allows the topology optimization to advance more rapidly to converge on the design goals, while also enforcing the design and manufacturing constraints. If accessible machining directions for various points on the boundary are not found, the scalar function values for these points are set to 0 and the topology optimization will not remove material that should be removed at these points, resulting in a larger, heavier, and less optimized design solution.

For each of Algorithms 7-9, for a particular point x on the boundary of the 3D model of the product, an initial machining direction comprising the negative of the surface normal at point x is added to the set of machining directions M (i.e., add $m_1 = -n(x)$ to M), which is potentially the most accessible direction. If the initial machining direction $m_1$ fails (point x is not determined to be accessible by the initial machining direction $m_1$), then each of Algorithms 7-9 performs searches based on a hemisphere above point x for additional machining directions to be added to the set of machining directions M. The hemisphere above point x may be generated using an arbitrary radius (e.g., a unit radius) with point x in the middle of the hemisphere. Each discrete point on the hemisphere above point x provides a possible machining direction to be added to the set of machining directions M. For example, a new machining direction may be determined by producing a vector from a discrete point on the hemisphere to point x. However, sampling each discrete point on the hemisphere to generate a new machining direction to be added to the set M would add a significantly large number of machining directions to set M, each of which require testing for accessibility to point x. Thus, sampling each discrete point on the hemisphere to generate new machining directions may be prohibitive in terms of processing time and use of processing resources.

In this regard, each of Algorithms 7-9 may guide a local search of the hemisphere for new machining directions and are each limited by a maximum number of iterations (maxIters) to limit the amount of sampling on the hemisphere. Each of Algorithms 7-9 may stop searching for new machining directions to add to set M once an accessible machining direction is found for point x or the maximum number of iterations (maxIters) is reached. In general, Algorithm 7 "NormalSearch" comprises a search for machining directions based on intersection points determined by ray casting operations. Algorithm 8 "HeatSearch" comprises a search for machining directions based on patterns or directions of heat diffusion. Algorithm 9 "SearchDirections" combines Algorithms 7-8 to provide an overall technique for determining an accessible direction for both the tool bit and tool head.

As discussed above in Section II, for a particular point x on the boundary to be accessible by a particular machining direction, it should be determined that both the tool bit and tool head can access point x in the particular machining direction. As described in relation to FIG. 4, a first ray casting operation is performed to determine whether a tool bit can access a particular point x on the boundary using a particular machining direction without any other portion of the tool bit making contact with any other portion of the product. If so, it is determined that the tool bit can successfully access point x using the particular machining direction (i.e., $V_{bit} \cap \Omega = \emptyset$). A second ray casting operation is then performed to determine whether a tool head can access same point x using the particular machining direction without any other portion of the tool head making contact with any other portion of the product. If so, it is determined that the tool head also can successfully access point x using the particular machining direction (i.e., $V_{head} \cap \Omega = \emptyset$). If both the tool bit and tool head are determined to successfully access point x using the particular machining direction, then the particular machining direction is determined to be an accessible machining direction for point x (i.e., $V_i \cap \Omega = \emptyset$).

In this regard, Algorithm 9 "SearchDirections" first determines whether Algorithm 8 "HeatSearch" is enabled or disabled. If Algorithm 8 "HeatSearch" is enabled, Algorithm 9 calls Algorithm 8 to select machining directions to be added to set M for testing for tool bit accessibility at current point x by the first ray casting operation. If no machining directions are found to be accessible by the tool bit, it is determined that there are no accessible machining directions for current point x and the scalar function value is set to equal 0. Algorithm 9 then calls Algorithm 7 to select machining directions to be added to set M for testing for tool head accessibility at current point x by the first ray casting operation. If no machining directions are found to be accessible by the tool head, it is determined that there are no accessible machining directions for current point x and the scalar function value is set to equal 0. However, if a particular machining direction is found by Algorithm 8 to be accessible by the tool bit and the same particular machining direction is found by Algorithm 7 to be accessible by the tool head, then this particular machining direction is determined to be an accessible machining direction for current point x and the scalar function value is determined based on the particular machining direction.

If Algorithm 8 "HeatSearch" is disabled, Algorithm 9 calls Algorithm 7 to select machining directions to be added to set M for testing for tool bit accessibility at current point x by the first ray casting operation. If no machining directions are found to be accessible by the tool bit, it is determined that there are no accessible machining directions for current point x and the scalar function value is set to equal 0. Algorithm 9 then calls Algorithm 7 to select machining directions to be added to set M for testing for tool head accessibility at current point x by the first ray casting operation. If no machining directions are found to be accessible by the tool head, it is determined that there are no accessible machining directions for current point x and the scalar function value is set to equal 0. However, if a particular machining direction is found by Algorithm 7 to be accessible by the tool bit and the same particular machining direction is found by Algorithm 7 to be accessible by the tool head, then this particular machining direction is determined to be an accessible machining direction for current point x and the scalar function value is determined based on the particular machining direction.

The operations performed by Algorithm 9 is expressed by the following pseudo-code:

---
Algorithm 9: SearchDirections
---
Input: Level set of $\Omega$, n, set of milling directions $\mathcal{M}$, algorithm mode, accessible enum,
    intersection point t
Result: Updated $\mathcal{M}$
if accessible == BitNotAccessible then
  if HeatSearchEnabled then
    HeatSearch($\Omega^+$,n,p,$\mathcal{M}$);
  else
    NormalSearch($\Omega$,r,n,p,t,$\mathcal{M}$);
  end
else if accessible == HeadNotAccessible then
  NormalSearch($\Omega$,h,n,p,t,$\mathcal{M}$);
end

---

As shown, Algorithm 9 receives as input level set $\Omega$, n, set of machining/milling directions M, algorithm mode, accessible enum, and intersection point t and determines an updated set of machining/milling directions M. Algorithm 9 updates the set of machining/milling directions M by calling on Algorithms 7 and 8 for adding new machining directions to set M for testing tool bit and/or tool head accessibility.

Algorithm 7 "NormalSearch" comprises a search for machining directions based on intersection points determined by ray casting operations. Algorithm 7 may be performed to select machining directions to test for accessibility of the tool bit and/the tool head for a current point x on the boundary depending on the implementation of Algorithm 9. The advantage of implementing Algorithm 7 for searching for machining directions is that a local search is performed that will often quickly find an accessible machining direction in very few iterations. However, implementing Algorithm 7 does not guarantee that an accessible machining direction can be found even if one exists and the method may move away from the accessible direction in some corner cases.

Figure 6:
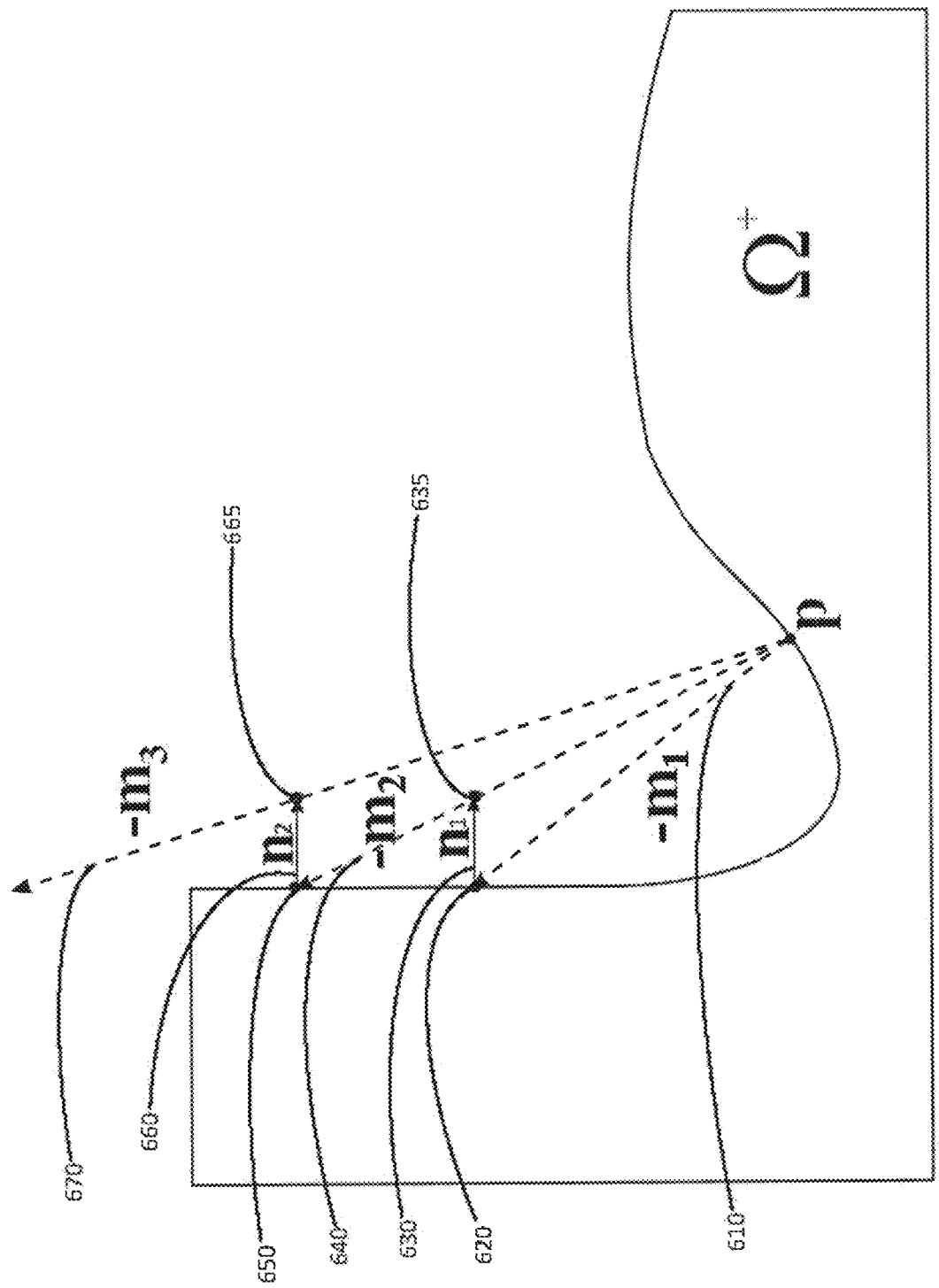
FIG. 6 is a conceptual diagram of an approach for determining machining directions, according to various embodiments of the present invention.

FIG. 6 is a conceptual diagram of an approach for determining machining directions, according to various embodiments of the present invention. For determining machining directions for tool bit accessibility for a particular point x, Algorithm 7 begins the search with a first machining direction ($m_1$=−n(x)) which is added to set M and tested for tool bit accessibility using the first ray casting operation. In the example of FIG. 6, the first ray casting operation determines that a first casting ray 610 (−$m_1$) originating at point p (corresponding to point x on the boundary of domain $\Omega$) intersects the boundary of offset domain $\Omega^+$ ($\Omega$ offset by tool bit radius r) at a first intersection point $t_1$ 620 and the first machining direction $m_1$ fails the test. Thus, point x is determined not to be accessible by the tool bit using the first machining direction $m_1$.

In response to the first machining direction $m_1$ failing, Algorithm 7 determines a second machining direction $m_2$ based, at least in part, on the first intersection point $t_1$ 620 and a first vector $n_1$ 630 comprising the surface normal of the offset domain $\Omega^+$ at the first intersection point $t_1$. In particular, Algorithm 7 determines the second machining direction $m_2$ based on a first offset point 635, which is determined based on the first intersection point $t_1$ 620, the first vector $n_1$ 630, and a first offset value. The location of the first offset point 635 is offset from the first intersection point $t_1$ 620 by the first offset value in the direction of the first vector $n_1$ 630. Algorithm 7 adds the second machining direction $m_2$ to set M which is then tested for tool bit accessibility using the first ray casting operation. In the example of FIG. 6, the first ray casting operation determines that a second casting ray 640 (−$m_2$) originating at point p intersects the boundary of offset domain $\Omega^+$ at a second intersection point $t_2$ 650 and the second machining direction $m_2$ fails the test. Thus, point x is determined not to be accessible by the tool bit using the second machining direction $m_2$.

In response, Algorithm 7 determines a third machining direction $m_3$ based, at least in part, on the second intersection point $t_2$ 650 and a second vector $n_2$ 660 comprising the surface normal of the offset domain $\Omega^+$ at the second intersection point $t_2$. In particular, Algorithm 7 determines the third machining direction $m_3$ based on a second offset point $t'_2$ 665, which is determined based on the second intersection point $t_2$ 650, second vector $n_2$ 660, and a second offset value. The location of the second offset point $t'_2$ 665 is offset from the second intersection point $t_2$ 650 by the second offset value in the direction of the second vector $n_2$ 660.

Algorithm 7 adds the third machining direction $m_3$ to set M which is then tested for tool bit accessibility using the first ray casting operation. Algorithm 7 may continue adding machining directions to set M in an iterative manner as described above until a machining direction is determined to be accessible by the tool bit or the maximum iterations is reached. In the example of FIG. 6, the first ray casting operation determines that a third casting ray 670 (−$m_3$) originating at point p does not intersect the boundary of offset domain $\Omega$ and the third machining direction $m_3$ passes the test. Thus, point x is determined be accessible by the tool bit using the third machining direction $m_3$. Once an accessible machining direction for the tool bit is determined for point x, Algorithm 7 stops. Algorithm 7 may also stop if no accessible machining directions are found and the maximum number of iterations is reached. If no accessible machining directions are found, then point x is determined to not be accessible in any machining directions and the scalar function value for point x is set to 0.

If an accessible machining direction for the tool bit is determined for point x, Algorithm 7 may then be used to determine an accessible machining direction for the tool head in a similar manner. However, the second ray casting operation is used which casts rays in direction −m that originate at point p'=p−m (b+h), where b equals the tool bit length and h equals the tool head radius. Also, the offset domain $\Omega^+$ comprises domain $\Omega$ offset by the tool head radius h. If a particular machining direction is found to be accessible by the tool bit and the tool head, then the particular machining direction is determined to be an accessible machining direction for current point x and the scalar function value is determined based on the particular machining direction.

As discussed above, Algorithm 7 determines the second machining direction $m_2$ based on the first offset point 635, which is determined based on the first intersection point $t_1$ 620, the first vector $n_1$ 630, and the first offset value. The location of the first offset point 635 is offset from the first intersection point $t_1$ 620 by the first offset value in the direction of the first vector $n_1$ 630. In some embodiments, to calculate the offset values that determine the location of the offset points $t'_1$, Algorithm 7 may implement a signed distance function $\phi(x)$ around the product domain $\Omega$. In these embodiments, every point sampled in the signed distance function comprises a scalar value comprising the closest distance to the boundary surface the product domain $\Omega$, whereby the sign of the scalar value is positive outside of $\Omega$ and negative inside of $\Omega$. For example, Algorithm 7 calculates the first offset value by iteratively searching in the direction of the first vector $n_1$ 630 until an edge of a narrow band (inside of which there are values for $\phi(x)$) or a shockwave in the signed distance function $\phi(x)$ is reached. The edge of the narrow band or shockwave in the signed distance function indicates the point at which the search is getting closer to another part of the surface of the product domain $\Omega$. The edge of the narrow band or shockwave may be used to determine the first offset value and thus the location of the first offset point $t'_1$ 635. Similar operations may be performed to calculate locations of other offset points $t'_1$.

The operations performed by Algorithm 7 is expressed by the following pseudo-code:

---
Algorithm 7: NormalSearch
---
Input: Signed distance field $\phi(x)$ of $\Omega$, offset distance o, n, p, t, set of milling directions $M$
Result: Updated $M$
LevelSetOffset($\Omega$,o);
done = false;
while !done do
| t' = t;
| t = t + n(t);
| done = $\phi(t) - \phi(t') \leq 0$;
end $M.\text{insert}\left(\frac{t-p}{\|t-p\|}\right)$

---

As shown, Algorithm 7 receives as input the signed distance field $\phi(x)$ of $\Omega$, offset distance o, n, p, t, set of milling directions M and determines an updated set of machining/milling directions M.

Figure 7:
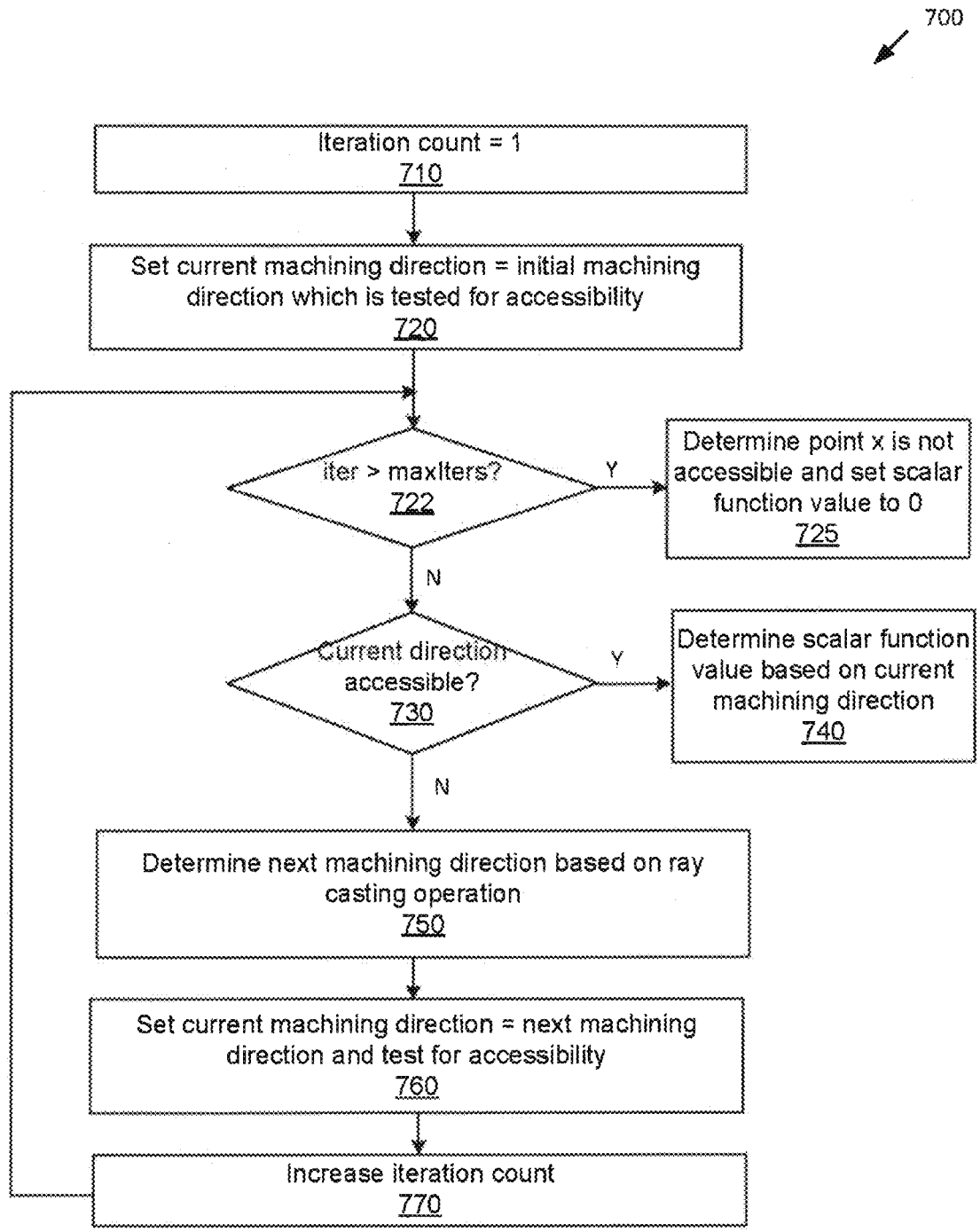
FIG. 7 illustrates a flow diagram of method steps for determining machining directions when performing topology optimization, according to various embodiments of the present invention.

FIG. 7 illustrates a flow diagram of method steps for determining machining directions when performing topology optimization, according to various embodiments of the present invention. Although the method steps are described in conjunction with the systems of FIGS. 1-4 and 6, persons skilled in the art will understand that the method steps can be performed in any order by any system. In some embodiments, the method 700 may be performed by a design engine 125 that implements Algorithm 9 "SearchDirections" in combination with Algorithm 7 "NormalSearch" to search for accessible machining directions for a tool bit for a predetermined number of maximum iterations. In some embodiments, the method 700 may be performed at step 550 of the method 500 of FIG. 5 for determining the set of machining directions M for a particular point x on the product boundary to perform the topology optimization on the product.

The method 700 begins when the design engine 125 sets (at step 710) the iteration count (iter) to equal 1. The design engine 125 sets (at step 720) a current machining direction $m_c$ to equal an initial machining direction $(m_1=-n(x))$ for point x, which is then added to set M and tested for tool bit accessibility using the first ray casting operation. The design engine 125 determines (at step 722) whether the iteration count is greater than the predetermined maximum iterations (maxIters). If not, the method 700 proceeds to step 730. The design engine 125 determines (at step 730) if point x is determined to be accessible by the tool bit using the current machining direction $m_c$. If so, the method 700 proceeds to step 740 where the design engine 125 returns the current machining direction $m_c$ as accessible by the tool bit and determines the scalar function value for point x based on the current machining direction $m_c$. The method 700 then ends.

If point x is determined not to be accessible by the tool bit using the current machining direction $m_c$ (at step 730—No), the method 700 proceeds to step 750. If step 750 is reached, this indicates that the first ray casting operation determines that a current casting ray originating at point p intersects the boundary of offset domain $\Omega^+$ ($\Omega$ offset by tool bit radius r) at a current intersection point $t_c$. At step 750, the design engine 125 determines a next machining direction $m_n$ based, at least in part, on the current intersection point $t_c$ and a current vector $n_c$ comprising the surface normal of the offset domain $\Omega^+$ at the current intersection point $t_c$. In particular, the next machining direction $m_n$ is determined based on a current offset point $t'_c$, which is determined based on the current intersection point $t_c$, the current vector $n_c$, and a current offset value. The location of the current offset point $t'_c$ is offset from the current intersection point $t_c$ by the current offset value in the direction of the current vector $n_c$.

The design engine 125 then sets (at step 760) the current machining direction $m_c$ to equal the next machining direction $m_n$ which is then added to set M and tested for tool bit accessibility using the first ray casting operation. The design engine 125 then increases (at step 770) the iteration count by one (iter=iter+1). The method 700 continues at step 722 for a next iteration. If the design engine 125 determines (at step 722—Yes) that the iteration count is greater than the predetermined maximum iterations (maxIters), the method 700 proceeds to step 725. At step 725, the design engine 125 determines that point x is not accessible by the tool bit in any machining direction and the scalar function value for point x is set to 0. The method 700 then ends.

The method 700 of FIG. 7 may also be performed to search for accessible machining directions for a tool head in a similar manner. However, the method 700 is modified such that the second ray casting operation (instead of the first ray casting operation) is used which casts rays in direction −m that originate at point p'=p−m (b+h), where b equals the tool bit length and h equals the tool head radius. Also, the offset domain $\Omega^+$ comprises domain $\Omega$ offset by the tool head radius h.

Algorithm 8 "HeatSearch" comprises a search for machining directions based on patterns or directions of heat diffusion. Algorithm 8 may be performed to select machining directions to test for accessibility of the tool bit for a current point x on the boundary depending on the implementation of Algorithm 9 (if Algorithm 8 is enabled or not). The advantage of implementing Algorithm 8 for searching for machining directions is that Algorithm 8 may more reliably find an accessible machining direction compared to Algorithm 7 and addresses the drawback of Algorithm 7 moving away from accessible directions. However, implementing Algorithm 8 may be computationally more intensive compared to Algorithm 7.

Algorithm 8 first determines a bounding box that encloses the product offset domain $\Omega^+$ (product domain $\Omega$ offset by tool bit radius r). In some embodiments, the bounding box is an axis aligned box that contains the entire offset domain $\Omega^+$ with padding equal to the narrow band (a predefined distance). In some embodiments, a temperature vector field $\phi_h(q)$ around the product domain $\Omega$ is determined. In some embodiments, a temperature vector field $\phi_h(q)$ within an intermediary volume between the boundary surface of the product domain $\Omega$ and the bounding box is then determined. In some embodiments, a temperature vector field $\phi_h(q)$ within an intermediary volume between the boundary surface of the offset domain $\Omega+$ and the bounding box is then determined. The temperature vector field may be determined by calculating intermediate temperatures at sampling points within the intermediate volume.

An intermediate temperature at a particular sampling point may be determined by solving a heat equation at the sampling point. For example, two Dirichlet boundary conditions may be set, whereby the temperature at the boundary surface of the offset domain $\Omega^+$ is set to equal zero and the temperature on the bounding box is set to equal one. In some embodiments, the heat equation may be solved between the offset domain $\Omega^+$ and the bounding box rather than between the product domain $\Omega$ and the bounding box since the boundary surface of the offset domain $\Omega^+$ may close off some exits from cavities in the product domain $\Omega$ that are narrower than the tool bit diameter.

Thus, for each sampling point within the intermediate volume, the temperature vector field comprises a temperature vector that originates from the sampling point and points in the direction that heat diffuses/dissipates from the boundary surface of the offset domain $\Omega^+$ towards the bounding box. Algorithm 8 then performs the search for machining directions by following the directions of heat diffusion away from the boundary surface of the offset domain $\Omega^+$ and towards the bounding box. Thus, Algorithm 8 uses the gradient $\nabla \phi_h(q)$ of the temperature vector field $\phi_h(q)$ to guide the search for the next machining direction.

Figure 8:
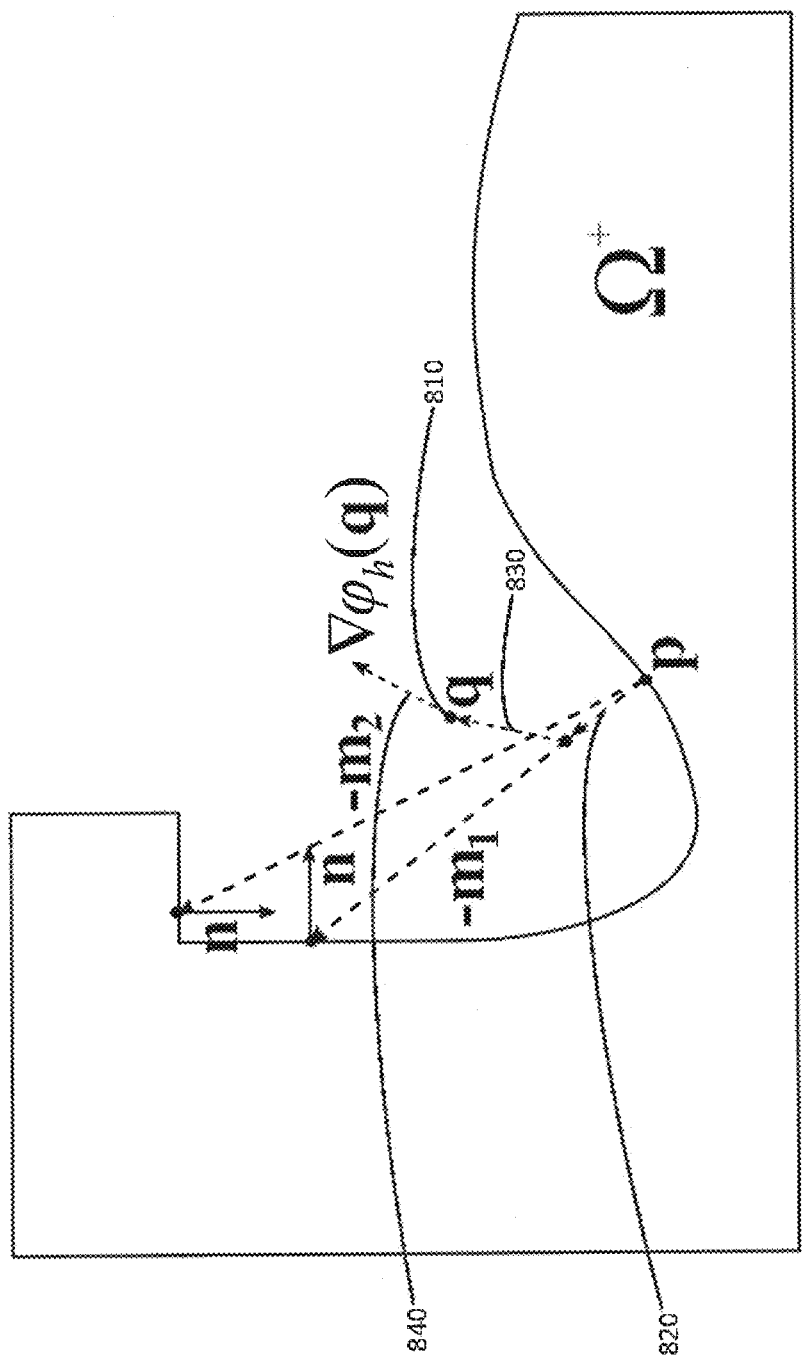
FIG. 8 is a conceptual diagram of operations of an approach for determining machining directions, according to other various embodiments of the present invention.

FIG. 8 is a conceptual diagram of operations of an approach for determining machining directions, according to other various embodiments of the present invention. For determining machining directions for tool bit accessibility for a particular point x, Algorithm 8 begins the search with a first machining direction 820 ($m_1 = -n(x)$) which is added to set M and tested for tool bit accessibility using the first ray casting operation. In the example of FIG. 8, the first ray casting operation determines that a first casting ray ($-m_1$) originating at point p intersects the boundary of offset domain $\Omega^+$ ($\Omega$ offset by tool bit radius r) at a first intersection point $t_1$ and the first machining direction $m_1$ fails the test. Thus, point x is determined not to be accessible by the tool bit using the first machining direction $m_1$. FIG. 8 also illustrates a selection of a second machining direction $m_2$ using Algorithm 7 "NormalSearch" based, at least in part, on the first intersection point $t_1$ and a vector n comprising the surface normal of the offset domain $\Omega^+$ at the intersection point t. As shown, Algorithm 7 "NormalSearch" is not able to find an accessible machining direction for the tool bit even though one exists as the search gets trapped by the overhanging geometry of the product domain $\Omega$.

However, Algorithm 8 is able to find an accessible machining direction for the tool bit since the search follows a trajectory that follows the gradient $\nabla \phi_h(q)$ of the temperature vector field to quickly finds an accessible machining direction. In particular, after the initial machining direction $m_1$ 820 is determined to be inaccessible by the tool bit, Algorithm 8 tracks the movement of a particle q that begins at point p and moves in the direction of the gradient $\nabla \phi_h(q)$ of the temperature vector field. At each iteration for a search for potential machining directions (up to a maximum iterations maxIters), particle q moves a predetermined distance in the direction of the gradient $\nabla \phi_h(q)$ of the temperature vector field to stop at a new particle location 810. For example, at a new iteration, particle q moves a predetermined distance in the direction of the gradient $\nabla \phi_h(q)$ of the temperature vector field to stop at a new particle location 810. The gradient $\nabla \phi_h(q)$ is recomputed using the new particle location 810, which gives a new milling direction 830 (vector $830 = \nabla \phi_h(q)$). If the new milling direction 830 fails (is not accessible), in a next iteration, particle q is advanced in the direction of the gradient $\nabla \phi_h(q)$ to a next particle location where the gradient $\nabla \phi_h(q)$ is recomputed, which gives a next milling direction 840 (vector $840 = \nabla \phi_h(q)$). Algorithm 8 may continue the iterations until an accessible machining direction or a maximum number of iterations is reached.

The operations performed by Algorithm 8 is expressed by the following pseudo-code:

---
Algorithm 8: HeatSearch

Input: Signed distance field $\phi(x)$ of $\Omega^+$, heat point q, set of milling directions $M$
Result: Updated $M$
// Solve the heat equation once $\phi_h(x) = \text{SolveHeatEquation}(\phi(x), \Omega^+)$;

$$q = q + \frac{\nabla \phi_h(q)}{\|\nabla \phi_h(q)\|};$$

$$M.\text{insert}\left(\frac{\nabla \phi_h(q)}{\|\nabla \phi_h(q)\|}\right)$$

---

As shown, Algorithm 8 receives as input the signed distance field $\phi(x)$ of 0+, head point q, and set of machining/milling directions M and determines an updated set of machining/milling directions M.

Figure 9:
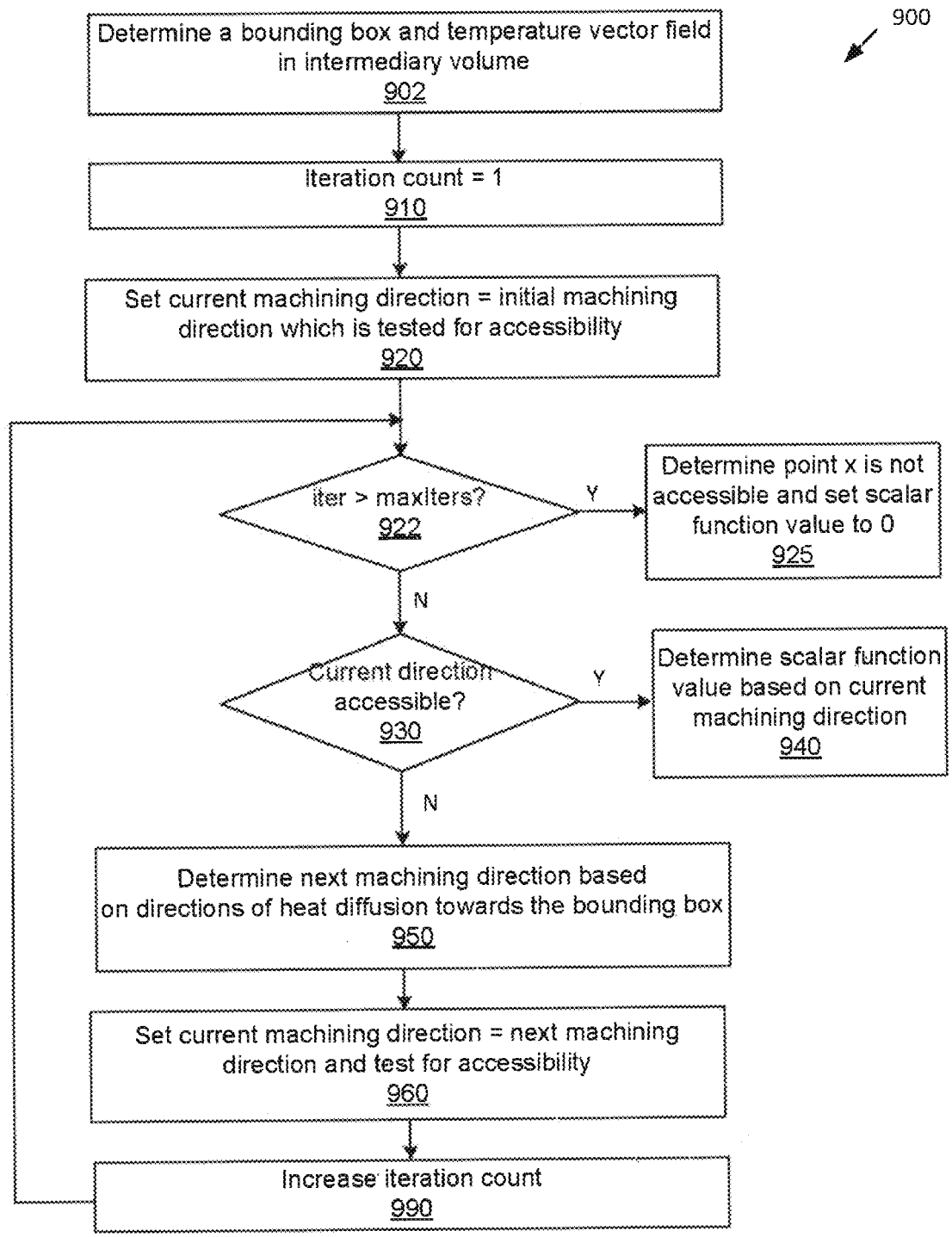
FIG. 9 illustrates a flow diagram of method steps for determining machining directions when performing topology optimization, according to other various embodiments of the present invention.

FIG. 9 illustrates a flow diagram of method steps for determining machining directions when performing topology optimization, according to other various embodiments of the present invention. Although the method steps are described in conjunction with the systems of FIGS. 1-4, 6, and 8, persons skilled in the art will understand that the method steps can be performed in any order by any system. In some embodiments, the method 900 may be performed by a design engine 125 that implements Algorithm 9 "SearchDirections" in combination with Algorithm 8 "HeatSearch" to search for accessible machining directions for a tool bit for a predetermined number of maximum iterations. In some embodiments, the method 900 may be performed at step 550 of the method 500 of FIG. 5 for determining the set of machining directions M for a particular point x on the product boundary to perform the topology optimization on the product.

The method 900 begins when the design engine 125 determines (at step 902) a bounding box that encloses the offset domain $\Omega^+$ (product domain $\Omega$ offset by tool bit radius r) and a temperature vector field $\phi_h(q)$ within an intermediary volume between the boundary surface of the offset domain $\Omega+$ and the bounding box. The design engine 125 then sets (at step 910) the iteration count (iter) to equal 1. The design engine 125 sets (at step 920) a current machining direction $m_c$ to equal an initial machining direction ($m_1 = -$ n(x)) for point x, which is then added to set M and tested for tool bit accessibility using the first ray casting operation.

The design engine 125 determines (at step 922) whether the iteration count is greater than the predetermined maximum iterations (maxIters). If not, the method 900 proceeds to step 930. The design engine 125 determines (at step 930) if point x is determined to be accessible by the tool bit using the current machining direction $m_c$. For example, the first ray casting operation may be used which casts a ray originating at point p. If so, the method 900 proceeds to step 940 where the design engine 125 returns the current machining direction $m_c$ as accessible by the tool bit and determines the scalar function value for point x based on the current machining direction $m_c$. The method 900 then ends.

If point x is determined not to be accessible by the tool bit using the current machining direction $m_c$ (at step 930—No), the method 900 proceeds to step 950. At step 950, the design engine 125 determines a next machining direction $m_n$ based, at least in part, on the directions of heat diffusion away from the boundary surface of the offset domain $\Omega^+$ and towards the bounding box as indicated in the temperature vector field. In some embodiments, the design engine 125 determines a next machining direction $m_n$ based, at least in part, on the gradient $\nabla\phi_h(q)$ of the temperature vector field. In particular, a movement of particle q begins at point p and moves a predetermined distance in the direction of the gradient of the temperature vector field to a current particle location. In some embodiments, the design engine 125 determines a next machining direction $m_n$ based, at least in part, on the current particle location. For example, the next machining direction $m_n$ may comprise a normalized vector starting at point p and pointing toward particle q located at the current particle location. Note that at a subsequent iteration of the method 900, particle q will move from the current particle location the predetermined distance in the direction of the gradient of the temperature vector field to a subsequent particle location, and the subsequent machining direction at the subsequent iteration is determined based on the subsequent particle location.

The design engine 125 then sets (at step 960) the current machining direction $m_c$ to equal the next machining direction $m_n$ which is then added to set M and tested for tool bit accessibility using the first ray casting operation. The design engine 125 then increases (at step 970) the iteration count by one (iter=iter+1). The method 900 continues at step 922 for a next iteration. If the design engine 125 determines (at step 922—Yes) that the iteration count is greater than the predetermined maximum iterations (maxIters), the method 900 proceeds to step 925. At step 925, the design engine 125 determines that point x is not accessible by the tool bit in any machining direction and the scalar function value for point x is set to 0. The method 900 then ends.

In sum, embodiments described herein include a design process for a product that implements topology optimization performed on an initial 3D model of the product based on a design problem statement and a set of manufacturing constraints. The set of manufacturing constraints may include a set of dimensions associated with the manufacturing machine. In some embodiments, the set of manufacturing constraints may include a set of dimensions for a tool bit of the manufacturing machine, a set of dimensions for a tool head of the manufacturing machine, a set of machining directions for a tool bit of the manufacturing machine, or any combination thereof. For illustrative purposes, the design engine implements level set based topology optimization to design the product. In other embodiments, the design engine may implement any other type of geometry synthesis technique for designing and generating geometries for the product.

At each iteration of the topology optimization, for each point x on the boundary of the 3D model of the product, a speed function at point x is multiplied by a scalar function value determined based on the set of manufacturing constraints. It is determined if each point x is accessible by the tool bit and tool head in at least one machining direction in the set of machining directions. Using the dimensions of the tool bit and the tool head, a 3D model of a union of the tool bit and tool head may be generated to determine accessibility of each point x in particular machining directions.

If point x is determined to not be accessible by the tool bit and tool head in at least one machining direction, then the scalar function value for point x is set to equal 0. If point x is determined to be accessible by the tool bit and tool head in at least one machining direction, then the scalar function value for point x is set to equal a positive value. By multiplying the speed function with the scalar function value at each iteration of the topology optimization, this causes the velocity function to equal 0 at each point x on the boundary of the product that is not accessible by the tool bit and tool head in any of the machining directions. Thus, movement of each inaccessible point x on the boundary is stopped at the iteration. Further, multiplying the speed function with the scalar function value ensures that during each iteration, an accessible point x on the boundary of the product is moved only in directions whereby point x on the modified boundary is still accessible by the tool bit and tool head.

Thus, the disclosed techniques perform topology optimization that iteratively converges on a design solution for the product that enforces/satisfies the design goals and design constraints, as well as enforcing/satisfying the set of manufacturing constraints. The design solution may comprise a final 3D model of the product to be physically produced by a subtractive manufacturing machine, whereby each point or portion on the surface boundary of the final 3D model is determined to be accessible by a tool bit and tool head in at least one machining direction of the subtractive manufacturing machine.

In some embodiments, the subtractive manufacturing machine comprises a 3-axis manufacturing machine and the set of machining directions is received from a user. In other embodiments, the subtractive manufacturing machine comprises a 5-axis manufacturing machine that is automatically capable of machining directions in an arbitrary number of axes. In these embodiments, the disclosed techniques may automatically generate the set of machining directions for a particular point x on the boundary of the product, and test for accessibility of the particular point x using each machining direction in the set of machining directions. The disclosed techniques may implement novel "direction-selecting" algorithms that selectively determine which machining directions are to be added to the set of machining directions and tested for accessibility. In some embodiments, a "NormalSearch" algorithm is used to search for machining directions to add to the set of machining directions based on intersection points determined by ray casting operations. In other embodiments, a "HeatSearch" algorithm is used to search for machining directions to add to the set of machining directions based on directions of heat diffusion. In further embodiments, both the "NormalSearch" algorithm and the "HeatSearch" algorithm are used to search for machining directions to add to the set of machining directions.

At least one technological improvement of the disclosed techniques relative to prior art is that manufacturing limitations/constraints of a manufacturing machine are considered when designing a product to be manufactured by the manufacturing machine. In particular, topology optimization on a 3D model of the product is performed based on the design problem statement for the product and a set of manufacturing constraints of the manufacturing machine. The set of manufacturing constraints may include a set of dimensions associated with the manufacturing machine. In some embodiments, the set of manufacturing constraints may include a set of dimensions for a tool bit of the manufacturing machine, a set of dimensions for a tool head of the manufacturing machine, a set of machining directions for a tool bit of the manufacturing machine, or any combination thereof. By considering the manufacturing constraints of the manufacturing machine during the design process for the product, the disclosed techniques may generate a design solution for the product that is more easily and directly manufactured by the manufacturing machine than a design solution generated by conventional design techniques. Thus, the disclosed techniques may also generate a design solution for the product that when manufactured by the manufacturing machine, requires significantly less post-processing operations than a design solution generated by conventional design techniques.

Aspects of the subject matter described herein are set out in the following numbered any of clauses.

1. In some embodiments, a computer-implemented method for designing a product for manufacture, the method comprising: determining a design problem statement for the product; determining a set of dimensions associated with a manufacturing machine; and performing one or more topology optimization operations on a three-dimensional (3D) model of the product based on the design problem statement and the set of dimensions associated with the manufacturing machine to generate a design solution for the product.

2. The computer-implemented method of clause 1, wherein the set of dimensions are associated with a tool bit of the manufacturing machine.

3. The computer-implemented method of any of clauses 1-2, wherein the set of dimensions are associated with a tool head of the manufacturing machine.

4. The computer-implemented method of any of clauses 1-3, wherein the set of dimensions comprises a tool bit radius and a tool bit length.

5. The computer-implemented method of any of clauses 1-4, wherein performing the one or more topology optimization operations comprises determining that a first point on a surface of the 3D model of the product is accessible by the tool bit based on the set of dimensions.

6. The computer-implemented method of any of clauses 1-5, wherein determining that the first point is accessible by the tool bit comprises determining that a 3D model of the tool bit is able to contact the first point without contacting any remaining portion of the 3D model of the product.

7. The computer-implemented method of any of clauses 1-6, wherein performing the one or more topology optimization operations further comprises multiplying a speed function at the first point by a positive scalar value.

8. The computer-implemented method of any of clauses 1-7, wherein performing the one or more topology optimization operations comprises determining that a first point on a surface of the 3D model of the product is not accessible by the tool bit based on the set of dimensions.

9. The computer-implemented method of any of clauses 1-8, wherein performing the one or more topology optimization operations further comprises multiplying a speed function at the first point by a scalar value equal to 0.

10. In some embodiments, a non-transitory computer-readable medium storing program instructions that, when executed by a processor, cause the processor to perform the steps of: determining a design problem statement for the product; determining a set of dimensions associated with a manufacturing machine; and performing one or more topology optimization operations on a three-dimensional (3D) model of the product based on the design problem statement and the set of dimensions associated with the manufacturing machine to generate a design solution for the product.

11. The non-transitory computer-readable medium of clause 10, wherein the set of dimensions comprises a set of dimensions for a tool bit of the manufacturing machine including a tool bit radius and a tool bit length.

12. The non-transitory computer-readable medium of any of clauses 10-11, wherein the set of dimensions comprises a set of dimensions for a tool head of the manufacturing machine including a tool head radius.

13. The non-transitory computer-readable medium of any of clauses 10-12, wherein: the manufacturing machine comprises a tool bit; and performing the one or more topology optimization operations comprises determining that a first point on a surface of the 3D model of the product is accessible by the tool bit based on the set of dimensions.

14. The non-transitory computer-readable medium of any of clauses 10-13, wherein: the manufacturing machine further comprises a tool head that holds the tool bit; and the first point is determined to be accessible by the tool bit if a 3D model of the tool bit can contact the first point without a 3D model of the tool head contacting any portion of the surface of the 3D model of the product, wherein the 3D model of the tool bit and the 3D model of the tool head are determined based on the set of dimensions.

15. The non-transitory computer-readable medium of any of clauses 10-14, wherein performing the one or more topology optimization operations further comprises multiplying a speed function at the first point by a positive scalar value.

16. The non-transitory computer-readable medium of any of clauses 10-15, wherein: the manufacturing machine comprises a tool bit; and performing the one or more topology optimization operations comprises determining that a first point on a surface of the 3D model of the product is not accessible by the tool bit based on the set of dimensions.

17. The non-transitory computer-readable medium of any of clauses 10-16, wherein performing the one or more topology optimization operations further comprises multiplying a speed function at the first point by a scalar value equal to 0.

18. The non-transitory computer-readable medium of any of clauses 10-17, wherein: the manufacturing machine comprises a tool bit; and the design solution for the product specifies a final 3D model of the product, wherein each point on a surface of the final 3D model is determined to be accessible by the tool bit.

19. In some embodiments, a computing system for designing a product for manufacture by a manufacturing machine, comprising: a memory that includes a design engine; and a processor that is coupled to the memory and, upon executing the design engine, performs the steps of: determining a design problem statement for the product; determining a set of dimensions associated with a manufacturing machine; and performing one or more topology optimization operations on a three-dimensional (3D) model of the product based on the design problem statement and the set of dimensions associated with the manufacturing machine to generate a design solution for the product.

20. The computing system of clause 19, wherein the set of dimensions are associated with a tool bit of the manufacturing machine.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for designing a product for manufacture, the method comprising:
   determining a design problem statement for a final product to be manufactured;
   determining a set of dimensions of a manufacturing machine;
   generating a computer-generated three-dimensional (3D) model of the final product to be manufactured based on the design problem statement;
   modifying the 3D model of the final product to be manufactured by moving one or more positions of one or more points on a surface of the 3D model based on the set of dimensions of the manufacturing machine; and
   generating a design solution for the final product to be manufactured that includes the modified 3D model of the final product.

2. The computer-implemented method of claim 1, wherein the set of dimensions is associated with a tool bit of the manufacturing machine.

3. The computer-implemented method of claim 1, wherein the set of dimensions is associated with a tool head of the manufacturing machine.

4. The computer-implemented method of claim 1, wherein the set of dimensions comprises a tool bit radius and a tool bit length.

5. The computer-implemented method of claim 2, wherein modifying the 3D model of the final product to be manufactured comprises determining that a first point on the surface of the 3D model of the final product is accessible by the tool bit based on the set of dimensions.

6. The computer-implemented method of claim 5, wherein determining that the first point is accessible by the tool bit comprises determining that a 3D model of the tool bit is able to contact the first point without contacting any remaining portion of the 3D model of the final product.

7. The computer-implemented method of claim 5, wherein modifying the 3D model of the final product to be manufactured further comprises multiplying a speed function at the first point by a positive scalar value.

8. The computer-implemented method of claim 1, wherein modifying the 3D model of the final product to be manufactured comprises:
  determining that a first point on the surface of the 3D model of the final product to be manufactured is not accessible by a tool of the manufacturing machine based on the set of dimensions of the manufacturing machine; and
  in response, moving a position of at least one of the first point or a second point on the surface of the 3D model of the final product to be manufactured such that the first point is accessible by the tool of the manufacturing machine.

9. The computer-implemented method of claim 8, wherein modifying the 3D model of the final product to be manufactured further comprises multiplying a speed function at the first point by a scalar value equal to 0.

10. One or more non-transitory computer-readable media storing program instructions that, when executed by one or more processors, cause the one or more processors to perform the steps of:
  determining a design problem statement for a final product to be manufactured;
  determining a set of dimensions of a manufacturing machine;
  generating a computer-generated three-dimensional (3D) model of the final product to be manufactured based on the design problem statement;
  modifying the 3D model of the final product to be manufactured by moving one or more positions of one or more points on a surface of the 3D model based on the set of dimensions of the manufacturing machine; and
  generating a design solution for the final product to be manufactured that includes the modified 3D model of the final product.

11. The one or more non-transitory computer-readable media of claim 10, wherein the set of dimensions comprises a set of dimensions for a tool bit of the manufacturing machine including a tool bit radius and a tool bit length.

12. The one or more non-transitory computer-readable media of claim 10, wherein the set of dimensions comprises a set of dimensions for a tool head of the manufacturing machine including a tool head radius.

13. The one or more non-transitory computer-readable media of claim 10, wherein:
  the manufacturing machine comprises a tool bit; and
  modifying the 3D model of the final product to be manufactured comprises determining that a first point on the surface of the 3D model of the final product is accessible by the tool bit based on the set of dimensions.

14. The one or more non-transitory computer-readable media of claim 13, wherein:
  the manufacturing machine further comprises a tool head that holds the tool bit; and
  the first point is determined to be accessible by the tool bit if a 3D model of the tool bit can contact the first point without a 3D model of the tool head contacting any portion of the surface of the 3D model of the final product, wherein the 3D model of the tool bit and the 3D model of the tool head are determined based on the set of dimensions.

15. The one or more non-transitory computer-readable media of claim 13, wherein modifying the 3D model of the final product to be manufactured further comprises multiplying a speed function at the first point by a positive scalar value.

16. The one or more non-transitory computer-readable media of claim 10, wherein:
  the manufacturing machine comprises a tool; and
  modifying the 3D model of the final product to be manufactured comprises:
    determining that a first point on the surface of the 3D model of the final product to be manufactured is not accessible by the tool based on the set of dimensions; and
    in response, moving a position of at least one of the first point or a second point on the surface of the 3D model of the final product to be manufactured such that the first point is accessible by the tool of the manufacturing machine.

17. The one or more non-transitory computer-readable media of claim 16, wherein modifying the 3D model of the final product to be manufactured further comprises multiplying a speed function at the first point by a scalar value equal to 0.

18. The one or more non-transitory computer-readable media of claim 10, wherein:
  the manufacturing machine comprises a tool bit; and
  the design solution for the final product to be manufactured specifies a final 3D model of the final product, wherein each point on a surface of the final 3D model is determined to be accessible by the tool bit.

19. A computing system for designing a product for manufacture by a manufacturing machine, comprising:
  one or more memories that includes a design engine; and
  one or more processors that are coupled to the one or more memories and, upon executing the design engine, perform the steps of:
    determining a design problem statement for the a final product to be manufactured;
    determining a set of dimensions of a manufacturing machine;
    generating a computer-generated three-dimensional (3D) model of the final product to be manufactured based on the design problem statement;
    modifying the 3D model of the final product to be manufactured by moving one or more positions of one or more points on a surface of the 3D model based on the set of dimensions of the manufacturing machine; and
    generating a design solution for the final product to be manufactured that includes the modified 3D model of the final product.

20. The computing system of claim 19, wherein the set of dimensions is associated with a tool bit of the manufacturing machine.

* * * * *

UNITED STATES PATENT AND TRADEMARK OFFICE
CERTIFICATE OF CORRECTION

PATENT NO. : 11,734,471 B2
APPLICATION NO. : 15/996405
DATED : August 22, 2023
INVENTOR(S) : Nigel Morris, Adrian Butscher and Francesco Iorio It is certified that error appears in the above-identified patent and that said Letters Patent is hereby corrected as shown below:

In the Claims

Column 40, Claim 19, Line 42, please delete "the".

Signed and Sealed this
Second Day of January, 2024

Katherine Kelly Vidal
*Director of the United States Patent and Trademark Office*